United States Patent
Yu et al.

(10) Patent No.: US 11,127,644 B2
(45) Date of Patent: Sep. 21, 2021

(54) PLANARIZATION OF SEMICONDUCTOR PACKAGES AND STRUCTURES RESULTING THEREFROM

(71) Applicant: Taiwan Semiconductor Manufacturing Company, Ltd., Hsinchu (TW)

(72) Inventors: Chi-Yang Yu, Zhongli (TW); Hai-Ming Chen, Kaohsiung (TW); Yu-Min Liang, Zhongli (TW); Jung Wei Cheng, Hsinchu (TW); Chien-Hsun Lee, Chu-tung Town (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/570,776

(22) Filed: Sep. 13, 2019

(65) Prior Publication Data

US 2020/0006171 A1    Jan. 2, 2020

Related U.S. Application Data

(62) Division of application No. 15/908,520, filed on Feb. 28, 2018, now Pat. No. 10,522,436.

(Continued)

(51) Int. Cl.
*H01L 23/18* (2006.01)
*H01L 21/3105* (2006.01)
(Continued)

(52) U.S. Cl.
CPC ........ *H01L 23/18* (2013.01); *H01L 21/31053* (2013.01); *H01L 21/4857* (2013.01);
(Continued)

(58) Field of Classification Search
CPC ............ H01L 24/20; H01L 24/19; H01L 2224/12105; H01L 2924/18162; H01L 2224/94; H01L 2224/04105; H01L 23/295; H01L 23/3737; H01L 2224/05798; H01L 2224/05898; H01L 2224/05998; H01L 2224/13198; H01L 2224/13398; H01L 2224/13498; H01L 2224/13698;
(Continued)

(56) References Cited

U.S. PATENT DOCUMENTS 7,458,885 B1    12/2008  Palaparthi
8,802,504 B1     8/2014  Hou et al.
(Continued)

FOREIGN PATENT DOCUMENTS

| KR | 20090018011 A | 2/2009 |
| KR | 20160123965 A | 10/2016 |
| KR | 20170015065 A | 2/2017 |

*Primary Examiner* — Nelson Garces
(74) *Attorney, Agent, or Firm* — Slater Matsil, LLP

(57) ABSTRACT

An embodiment method includes encapsulating a semiconductor die in an encapsulant, planarizing the encapsulant, and depositing a polymer material on the encapsulant. The method further includes planarizing the polymer material and forming a metallization pattern on the polymer material. The metallization pattern electrically connects a die connector of the semiconductor die to a conductive feature disposed outside of the semiconductor die.

20 Claims, 51 Drawing Sheets

Related U.S. Application Data

(60) Provisional application No. 62/586,558, filed on Nov. 15, 2017.

(51) Int. Cl.
| | |
|---|---|
| *H01L 23/31* | (2006.01) |
| *H01L 21/48* | (2006.01) |
| *H01L 21/56* | (2006.01) |
| *H01L 23/29* | (2006.01) |
| *H01L 21/683* | (2006.01) |
| *H01L 25/065* | (2006.01) |
| *H01L 23/00* | (2006.01) |

(52) U.S. Cl.
CPC ............ *H01L 21/56* (2013.01); *H01L 21/561* (2013.01); *H01L 21/6835* (2013.01); *H01L 23/295* (2013.01); *H01L 23/3128* (2013.01); *H01L 25/0652* (2013.01); *H01L 21/31058* (2013.01); *H01L 21/568* (2013.01); *H01L 21/6836* (2013.01); *H01L 24/13* (2013.01); *H01L 24/29* (2013.01); *H01L 2221/68318* (2013.01); *H01L 2221/68336* (2013.01); *H01L 2221/68359* (2013.01); *H01L 2221/68372* (2013.01); *H01L 2221/68381* (2013.01); *H01L 2224/18* (2013.01); *H01L 2224/48091* (2013.01); *H01L 2224/48227* (2013.01); *H01L 2224/73267* (2013.01); *H01L 2224/85203* (2013.01); *H01L 2924/00014* (2013.01); *H01L 2924/1203* (2013.01); *H01L 2924/1304* (2013.01); *H01L 2924/1436* (2013.01); *H01L 2924/1461* (2013.01); *H01L 2924/15311* (2013.01); *H01L 2924/181* (2013.01)

(58) Field of Classification Search
CPC . H01L 2224/13898; H01L 2224/13998; H01L 21/56–565; H01L 23/16–26; H01L 23/315; H05K 2201/0254; G03G 2215/2054; G11B 2007/25405; G05B 2219/50128

See application file for complete search history.

(56) References Cited

U.S. PATENT DOCUMENTS

| | | |
|---|---|---|
| 8,803,292 B2 | 8/2014 | Chen et al. |
| 8,803,316 B2 | 8/2014 | Lin et al. |
| 8,993,380 B2 | 3/2015 | Hou et al. |
| 9,281,254 B2 | 3/2016 | Yu et al. |
| 9,299,649 B2 | 3/2016 | Chiu et al. |
| 9,496,189 B2 | 3/2016 | Yu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,741,690 B1 | 8/2017 | Hsieh et al. |
| 2003/0205817 A1 | 11/2003 | Romankiw |
| 2007/0090545 A1 | 4/2007 | Condie et al. |
| 2012/0286418 A1 | 11/2012 | Lee et al. |
| 2014/0127886 A1 | 5/2014 | Sung et al. |
| 2014/0319683 A1 | 10/2014 | Lin et al. |
| 2016/0247779 A1 | 8/2016 | Yu et al. |
| 2016/0284667 A1 | 9/2016 | Yu et al. |
| 2016/0307872 A1 | 10/2016 | Chen et al. |
| 2017/0033063 A1* | 2/2017 | Lin .................... H01L 21/561 |
| 2017/0250138 A1 | 8/2017 | Hsieh et al. |

* cited by examiner

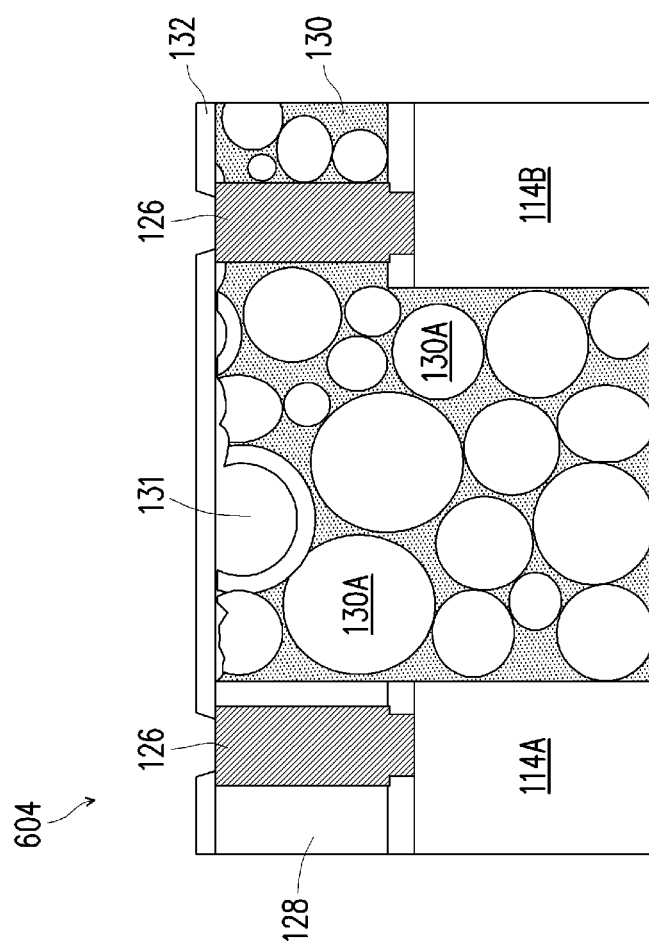

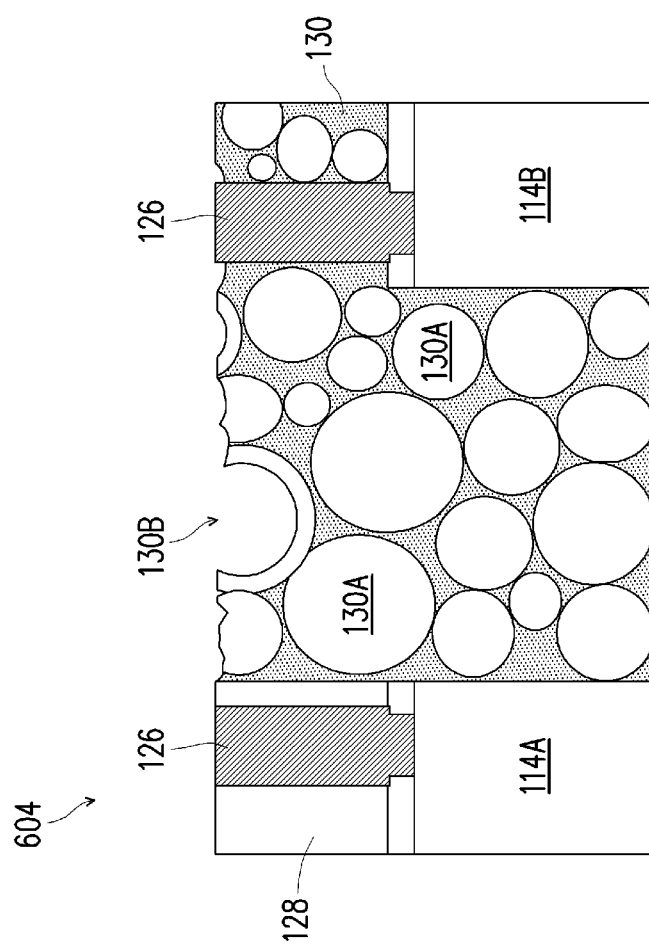

PLANARIZATION OF SEMICONDUCTOR PACKAGES AND STRUCTURES RESULTING THEREFROM

PRIORITY CLAIM AND CROSS-REFERENCE

This application is a divisional of U.S. patent application Ser. No. 15/908,520, filed on Feb. 28, 2018, and entitled "Metallization Patterns in Semiconductor Packages and Method of Forming the Same," which claims the benefit of U.S. Provisional Application No. 62/586,558, filed on Nov. 15, 2017, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1, 2, 3, 4A, 4B, 5, 6A, 6B, 7A, 7B, 8A, 8B, 9A, 9B, 10A, 10B, 11A, 11B, 12, 13, 14, 15, 16, 17, 18, 19, 20, 21, 22, 23, 24, 25A, and 25B illustrate cross-sectional views of intermediate steps during a process for forming a package in accordance with some embodiments.

FIGS. 28A, 28B, 29A, 29B, 30A, 30B, 31A, 31B, 32A, 32B, 32C, 33A, 33B, 33C, 34A, and 34B illustrate cross-sectional views of intermediate steps during a process for forming a package in accordance with some alternative embodiments.

DETAILED DESCRIPTION

Figure 1:
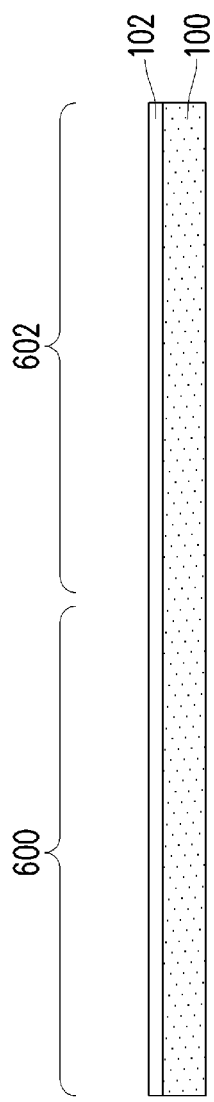

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a package structure (e.g., a package on package (PoP) structure) having a polymer layer disposed on an encapsulant. The encapsulant is disposed around one or more integrated circuit dies as well as conductive vias extending through the encapsulant. Further, the encapsulant may be dispensed, cured, and then planarized in order to expose contacts of the integrated circuit dies and the through vias. However, due to fillers disposed within the encapsulant, the planarization process may result in the molding compound having an uneven top surface after planarization. This uneven top surface may further cause manufacturing defects in features formed over the encapsulant. For example, some of the fillers may have hollow cores and planarizing these fillers may result in pits (e.g., resulting from exposing the hollow cores) at the top surface of the molding compound after planarization. Even without hollow core fillers, a surface texture of the molding compound after planarization may be undesirably rough. As a result of the pits and the rough surface of the molding compound, metallization patterns (sometimes referred to as redistribution lines or redistribution layers) formed on the molding compound may suffer from manufacturing defects, such as broken lines in the metallization pattern (e.g., leading to open circuits) and/or bridged lines in the metallization pattern (e.g., leading to shorted out circuits).

In various embodiments, to provide an improved surface topography for the subsequent formation of metallization patterns, a polymer material may be dispensed on the molding compound. A planarization process may then be applied to the polymer material. In some embodiments, the polymer material may be substantially free of fillers, which allows an upper surface of the polymer material to have improved smoothness after planarization compared to the molding compound. It has been observed that by including this polymer material on the top surface of the molding compound, manufacturing defects in the formation of metallization patterns over the molding compound may be advantageously reduced.

FIGS. 1 through 25 illustrate cross-sectional views of intermediate steps during a process for forming a first package component in accordance with some embodiments. FIG. 1 illustrates a carrier substrate 100 and a release layer 102 formed on the carrier substrate 100. A first package region 600 and a second package region 602 for the formation of a first package and a second package, respectively, are illustrated.

The carrier substrate 100 may be a glass carrier substrate, a ceramic carrier substrate, or the like. The carrier substrate 100 may be a wafer, such that multiple packages can be formed on the carrier substrate 100 simultaneously. The release layer 102 may be formed of a polymer-based material, which may be removed along with the carrier substrate 100 from the overlying structures that will be formed in subsequent steps. In some embodiments, the release layer 102 is an epoxy-based thermal-release material, which loses its adhesive property when heated, such as a light-to-heat-conversion (LTHC) release coating. In other embodiments, the release layer 102 may be an ultra-violet (UV) glue, which loses its adhesive property when exposed to UV lights. The release layer 102 may be dispensed as a liquid and cured, may be a laminate film laminated onto the carrier substrate 100, or may be the like. The top surface of the release layer 102 may be leveled and may have a high degree of coplanarity.

Figure 2:
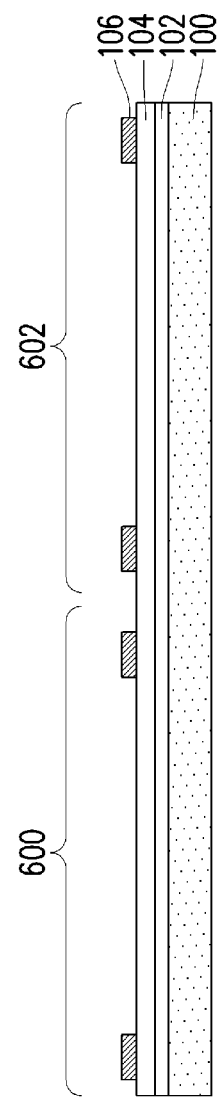
Figure 3:
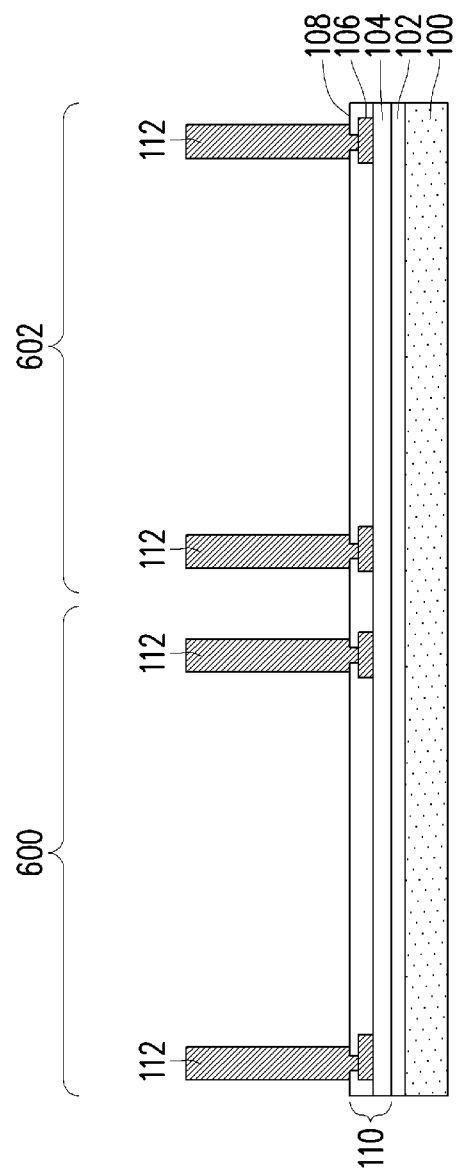

FIGS. 2 through 3 illustrate the formation of an optional back-side redistribution structure 110 (see FIG. 3) and optional through vias 112 (see FIG. 3). In other embodiments, the backside redistribution structure 110 and the through vias 112 may be omitted (see e.g., the embodiment of FIGS. 4B and 25B). In FIG. 2, a dielectric layer 104 and a metallization pattern 106 (sometimes referred to as a redistribution layer 106 or redistribution line 106) are formed. As illustrated in FIG. 2, a dielectric layer 104 is formed on the release layer 102. The bottom surface of the dielectric layer 104 may be in contact with the top surface of the release layer 102. In some embodiments, the dielectric layer 104 is formed of a polymer, such as polybenzoxazole (PBO), polyimide, benzocyclobutene (BCB), or the like. In other embodiments, the dielectric layer 104 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 104 may be formed by any acceptable deposition process, such as spin coating, chemical vapor deposition (CVD), laminating, the like, or a combination thereof.

The metallization pattern 106 is formed on the dielectric layer 104. As an example to form metallization pattern 106, a seed layer (not shown) is formed over the dielectric layer 104. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 106. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 106.

In FIG. 3, a dielectric layer 108 is formed on the metallization pattern 106 and the dielectric layer 104. In some embodiments, the dielectric layer 108 is formed of a polymer, which may be a photo-sensitive material such as PBO, polyimide, BCB, or the like, that may be patterned using a lithography mask. In other embodiments, the dielectric layer 108 is formed of a nitride such as silicon nitride; an oxide such as silicon oxide, PSG, BSG, BPSG; or the like. The dielectric layer 108 may be formed by spin coating, lamination, CVD, the like, or a combination thereof. The dielectric layer 108 is then patterned to form openings to expose portions of the metallization pattern 106. The patterning may be by an acceptable process, such as by exposing the dielectric layer 108 to light when the dielectric layer is a photo-sensitive material or by etching using, for example, an anisotropic etch.

The dielectric layers 104 and 108 and the metallization patterns 106 may be referred to as a back-side redistribution structure 110. As illustrated, the back-side redistribution structure 110 includes the two dielectric layers 104 and 108 and one metallization pattern 106. In other embodiments, the back-side redistribution structure 110 can include any number of dielectric layers, metallization patterns, and vias, or the back-side redistribution structure 110 may be omitted entirely. One or more additional metallization pattern and dielectric layer may be formed in the back-side redistribution structure 110 by repeating the processes for forming a metallization patterns 106 and dielectric layer 108. Vias may be formed during the formation of a metallization pattern by forming the seed layer and conductive material of the metallization pattern in the opening of the underlying dielectric layer. The vias may therefore interconnect and electrically couple the various metallization patterns. In some embodiments, the back-side redistribution structure 110 may be excluded.

Further in FIG. 3, optional through vias 112 are formed. As an example to form the through vias 112, a seed layer is formed over the back-side redistribution structure 110 (when present), e.g., the dielectric layer 108 and the exposed portions of the metallization pattern 106 as illustrated. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is formed and patterned on the seed layer. The photo resist may be formed by spin coating or the like and may be exposed to light for patterning. The pattern of the photo resist corresponds to through vias. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. The photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form through vias 112. In other embodiments, the through vias 112 may be omitted (e.g., see FIGS. 4B and 25B).

Figure 4A:
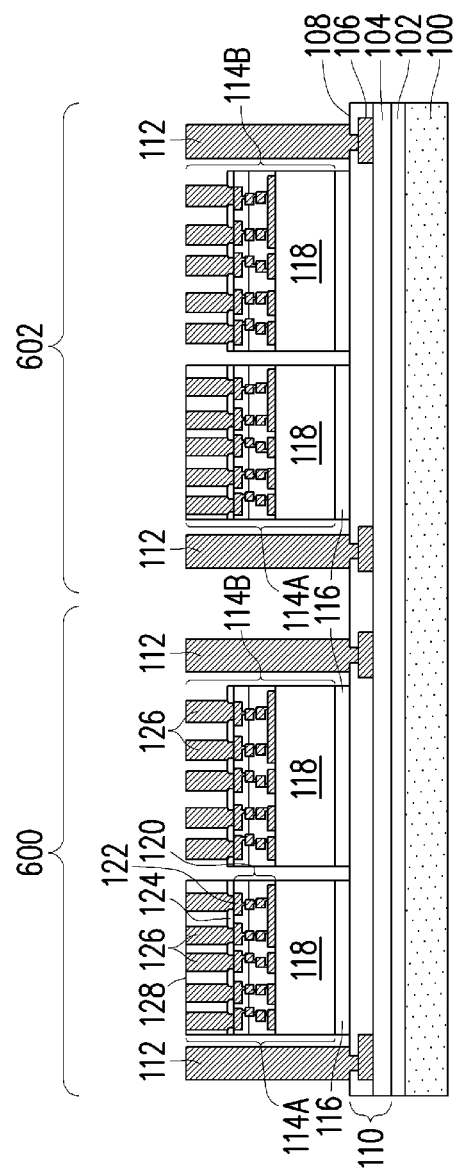

In FIG. 4A, integrated circuit dies 114A and 114B are adhered to the dielectric layer 108 by an adhesive 116. As illustrated in FIG. 4A, two integrated circuit dies 114A/114B are adhered in each of the first package region 600 and the second package region 602, and in other embodiments, more or less integrated circuit dies 114A/114B may be adhered in each region. For example, in an embodiment, only one integrated circuit die 114A and/or 114B may be adhered in each region. The integrated circuit dies 114A/114B may be logic dies (e.g., central processing unit, microcontroller, etc.), memory dies (e.g., dynamic random access memory (DRAM) die, static random access memory (SRAM) die, a hybrid memory cube (HMC), a wide input/output (wideIO) memory die, magnetoresistive random access memory (mRAM) die, resistive random access memory (rRAM) die, etc.), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. For example, the integrated circuit dies 114A/114B may be perform the same type of functions or different types of functions. In an embodiment, the integrated circuit die 114A is a processor die while the integrated circuit die 114B is a memory die. Also, in some embodiments, the integrated circuit dies 114A/114B may be different sizes (e.g., different heights and/or surface areas), and in other embodiments, the integrated circuit dies 114A/114B may be the same size (e.g., same heights and/or surface areas).

Before being adhered to the dielectric layer 108, the integrated circuit dies 114A/114B may be processed according to applicable manufacturing processes to form integrated circuits in the integrated circuit dies 114A/114B. For example, the integrated circuit dies 114A/114B each include a semiconductor substrate 118, such as silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate 118 and may be interconnected by interconnect structures 120 formed by, for example, metallization patterns in one or more dielectric layers on the semiconductor substrate 118 to form an integrated circuit.

The integrated circuit dies 114A/114B further comprise pads 122, such as aluminum pads, to which external connections are made. The pads 122 are on what may be referred to as respective active sides of the integrated circuit dies 114A/114B. Passivation films 124 are on the integrated circuit dies 114A/114B and on portions of the pads 122. Openings are through the passivation films 124 to the pads 122. Die connectors 126, such as conductive pillars (for example, comprising a metal such as copper), are in the openings through the passivation films 124 and are mechanically and electrically coupled to the respective pads 122. The die connectors 126 may be formed by, for example, plating, or the like. The die connectors 126 electrically couple the respective integrated circuits of the integrate circuit dies 114A/114B.

A dielectric material 128 is on the active sides of the integrated circuit dies 114A, such as on the passivation films 124 and the die connectors 126. The dielectric material 128 laterally encapsulates the die connectors 126, and the dielectric material 128 is laterally coterminous with the respective integrated circuit dies 114A. The dielectric material 128 may be a polymer such as PBO, polyimide, BCB, or the like; a nitride such as silicon nitride or the like; an oxide such as silicon oxide, PSG, BSG, BPSG, or the like; the like, or a combination thereof, and may be formed, for example, by spin coating, lamination, CVD, or the like. Further, in some embodiments, the dielectric material 128 is omitted from the integrated circuit dies 114B such that top surfaces and sidewalls of the die connectors 126 are exposed. In other embodiments (not illustrated), the dielectric material 128 may be formed around the die connectors of the integrated circuit dies 114B.

Figure 4B:
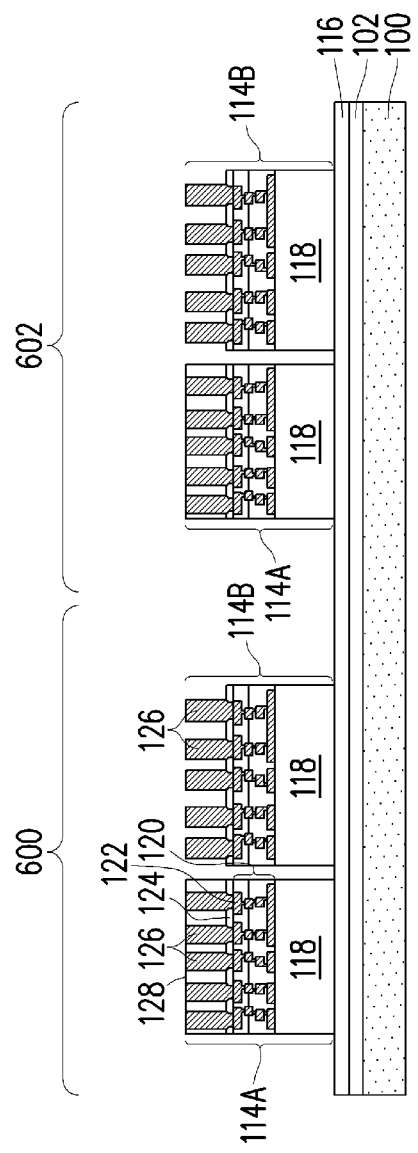

Adhesive 116 is on back-sides of the integrated circuit dies 114A/114B and adheres the integrated circuit dies 114A/114B to the back-side redistribution structure 110, such as the dielectric layer 108 in the illustration. The adhesive 116 may be any suitable adhesive, epoxy, die attach film (DAF), or the like. The adhesive 116 may be applied to a back-side of the integrated circuit dies 114A/114B, such as to a back-side of the respective semiconductor wafer or may be applied over the surface of the carrier substrate 100. The integrated circuit dies 114A/114B may be singulated, such as by sawing or dicing, and adhered to the dielectric layer 108 by the adhesive 116 using, for example, a pick-and-place tool. In some embodiments (e.g., as illustrated by FIG. 4A), the adhesive 116 is adhered to each of the integrated circuit dies 114A/114B prior to the integrated circuit dies 114A/114B being attached to the carrier substrate 100. In other embodiments (e.g., as illustrated by FIG. 4B), particularly when the back-side RDLs 110 and the through vias 112 are omitted, the adhesive 116 may be blanket deposited onto the carrier substrate 110 such that a continuous adhesive 116 covers an entirety of the carrier substrate 110. In such embodiments, after the adhesive 116 is deposited, the integrated circuit dies 114A/114B are placed on the adhesive 116 and adhered to the carrier substrate 100.

Figure 5:
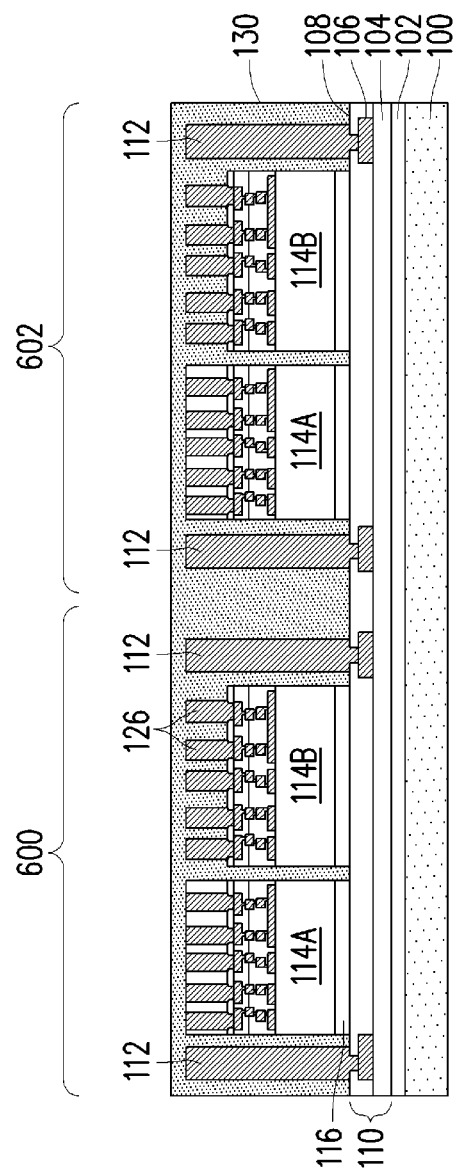

In FIG. 5, an encapsulant 130 is formed on the various components. The encapsulant 130 may be a molding compound, epoxy, or the like, and may be applied by compression molding, transfer molding, or the like. The encapsulant 130 may further comprise fillers, such as, silica, or the like (e.g., fillers 130A, see FIG. 6B). In some embodiments, some or all of the filler in the encapsulant 130 may be hollow. The encapsulant 130 may be dispensed in liquid form around the through vias 112 and the integrated circuit dies 114A/114B. In embodiments where sidewalls of the die connectors 126 of the integrated circuit dies 114B are exposed, the encapsulant may further be dispensed around the die connectors 126 of the integrated circuit dies 114B. For example, the encapsulant 130 may physically contact the die connectors 126 of the integrated circuit dies 114B. The encapsulant may be dispensed to cover top surfaces of the though vias 112 and the integrated circuit dies 114A/114B. After the encapsulant 130 is dispensed, a curing process may be performed to harden the encapsulant 130.

After curing, the encapsulant 130 can undergo a planarization process (e.g., a mechanical grinding, a chemical mechanical polish (CMP), or the like) to expose the through vias 112 and the die connectors 126 as illustrated by FIG.

Figure 6A:
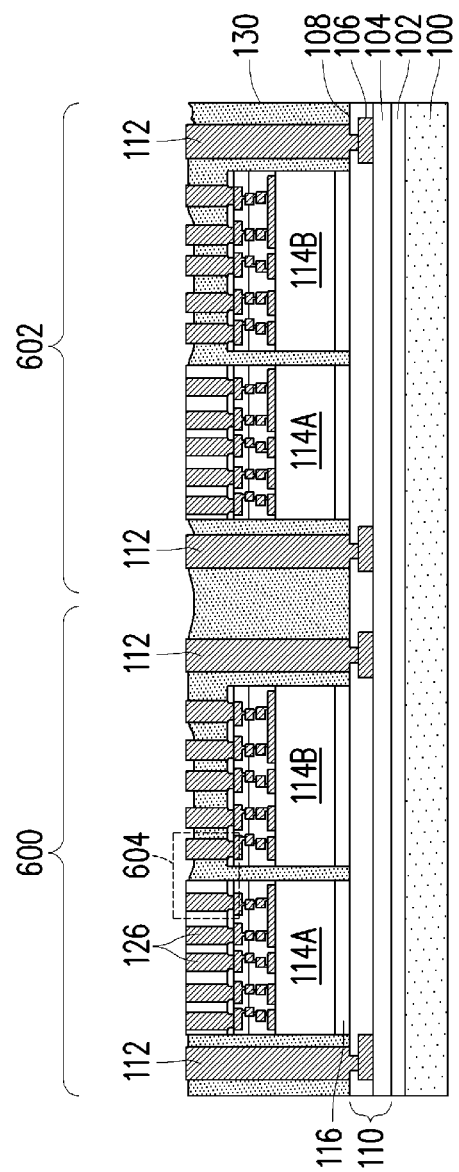
Figure 6B:
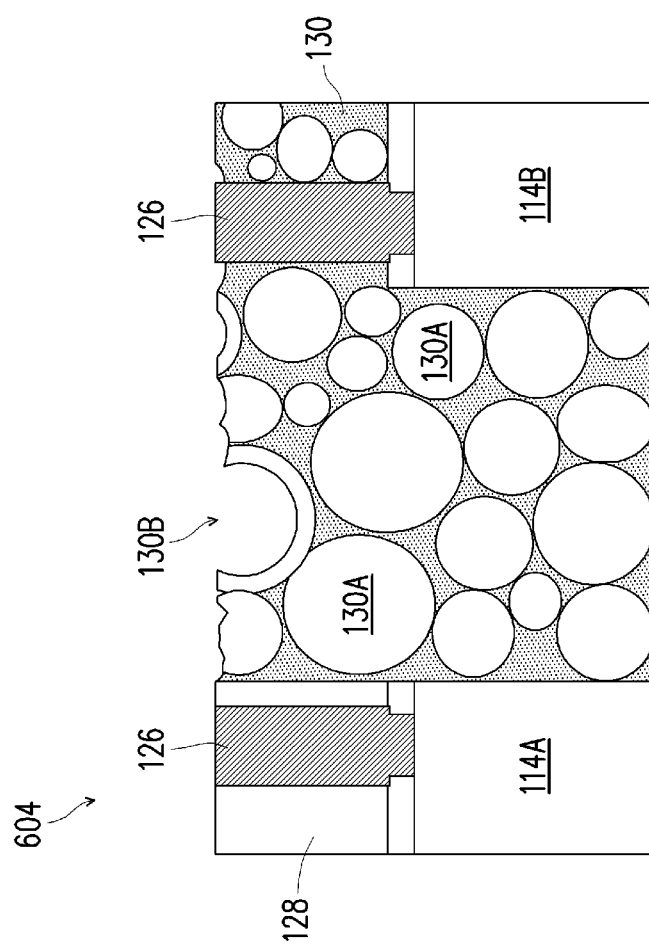

6A. FIG. 6B illustrates a detailed cross-sectional view of region 604 in FIG. 6A. As a result of the planarization process, a top surface of the encapsulant 130 may be uneven. The unevenness of the top surface of the encapsulant 130 may be at least partially a result of the filler in the encapsulant 130. For example, referring to FIG. 6B, the planarization process may expose the hollow core 130B of one or more fillers 130A, which results in pits at the top surface of the molding 130. Further, even when the fillers 130A have solid cores, the planarization may crack fillers 130A and/or remove fillers 130A such that a top surface of the encapsulant 130 is uneven after planarization.

Figure 7A:
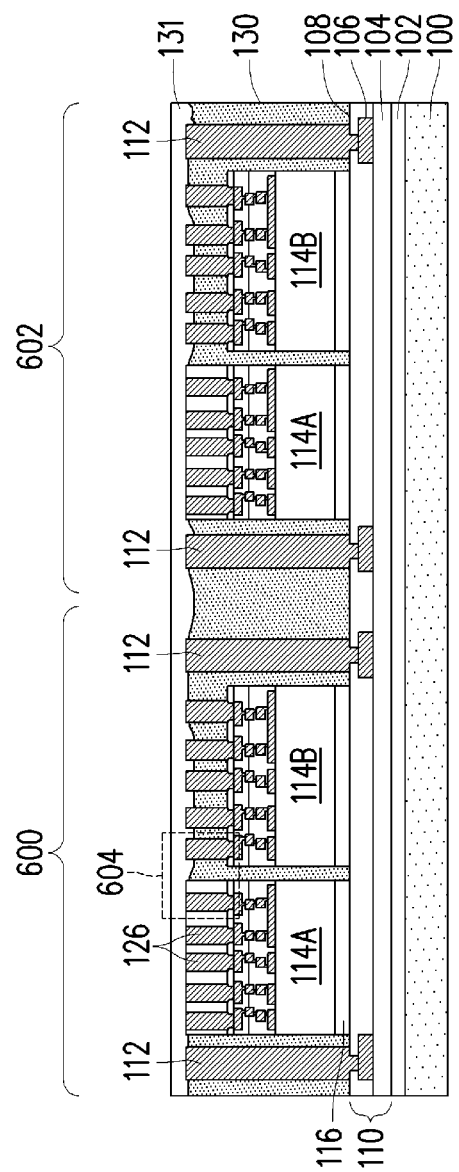
Figure 7B:
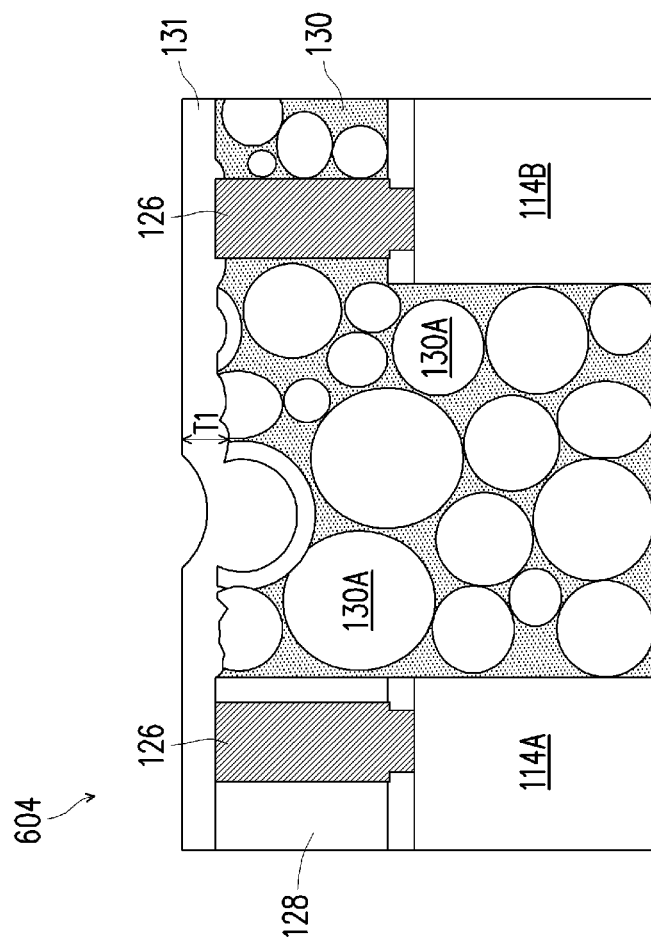

After planarization, a polymer material 131 is formed on the encapsulant 130 as illustrated by FIG. 7A. FIG. 7B illustrates a detailed cross-sectional view of region 604 in FIG. 7A. The polymer material 131 may comprise PBO, polyimide, BCB, or the like. In some embodiments, the polymer material 131 is a photo-sensitive material. Forming the polymer material 131 may comprise a coating process, such as a spin-on process. The polymer material 131 may be coated to fill pits and other depressions at the top surface of the encapsulant 130. The polymer material 131 may further cover top surfaces of the die connectors 126 and the through vias 112. For example, referring to FIG. 7B, the polymer material 131 may fill any exposed hollow cores 130B (see FIG. 6B) of the fillers 130A. The polymer material 131 may be dispensed to a thickness T1 in order to provide sufficient coverage of the uneven topography of the encapsulant 130. In some embodiments, a ratio of thickness T1 of the polymer layer to an average diameter of the fillers 130A to thickness T1 of the polymer layer may be at least about 0.5. In some embodiments, the thickness T1 of the polymer layer is at least 10 µm. In some embodiments, the coating process used to form the polymer material 131 along with the uneven topography of the encapsulant 130 may result in a top surface of the polymer material 131 being non-planar. For example, portions of the top surface of the polymer material 131 directly over exposed hollow cores 130B (see FIG. 6B) may be uneven.

After coating, a curing process (e.g., an anneal) may be applied to the polymer material 131. In embodiments where one or more of the integrated circuit dies 114A/114B are temperature sensitive (e.g., memory dies), the polymer material 131 may comprise a low-temperature polymer, which is cured at a relatively low temperature (e.g., less than about 300° C.) so as not to damage the integrated circuit dies 114A/114B. In other embodiments, the polymer material 131 may be cured at any suitable temperature.

Figure 8A:
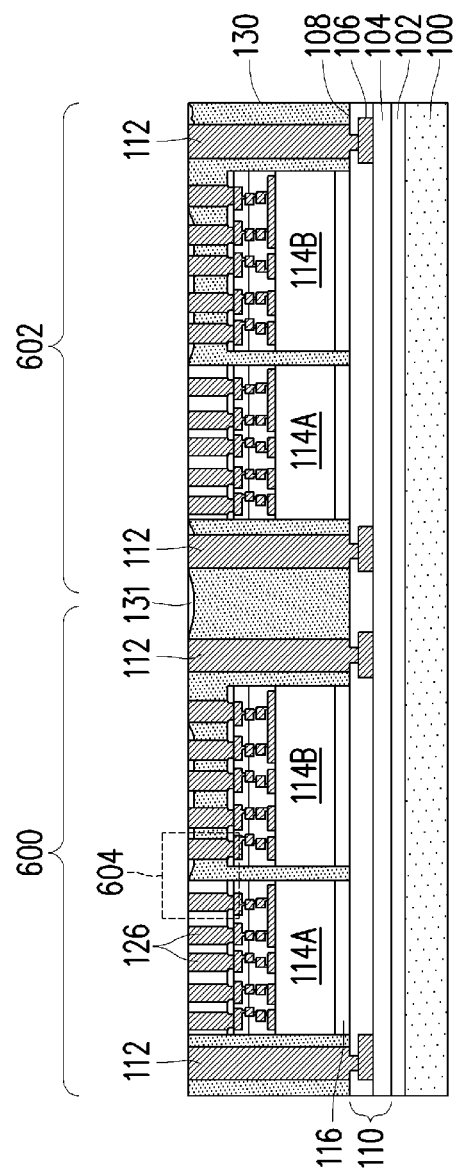
Figure 8B:
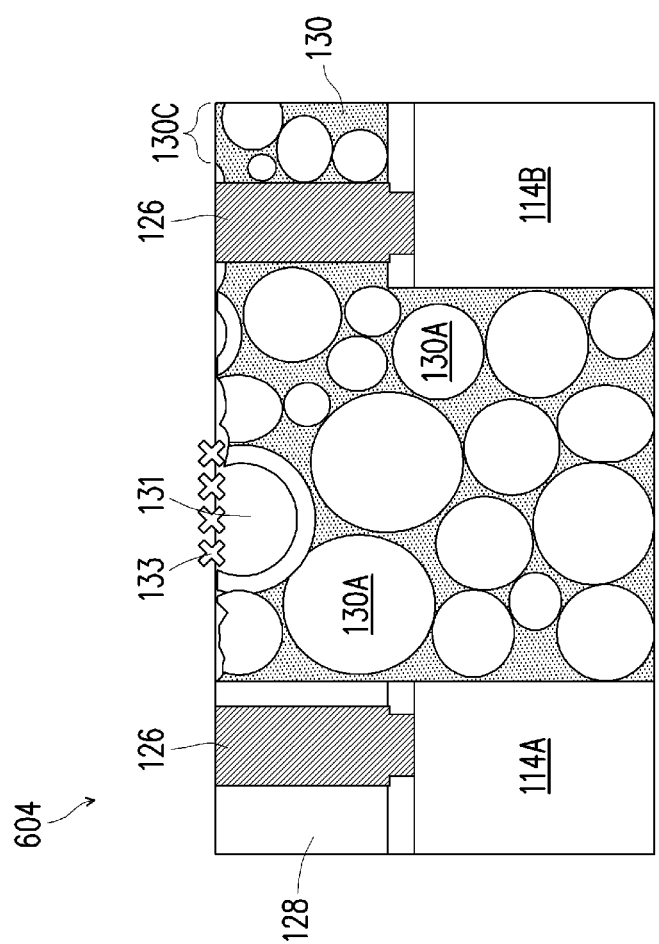

In FIGS. 8A and 8B, a planarization process is applied to the polymer material 131 to expose the die connectors 126 and the through vias 112. FIG. 8B illustrates a detailed cross-sectional view of region 604 in FIG. 8A. The planarization process further provides a top surface with a high degree of planarity for forming additional features (e.g., metallization patterns) over the encapsulant 130 and the polymer material 131. In some embodiments, the planarization process comprises a CMP using a chemical slurry which selectively removes the polymer material 131 at a higher rate than the encapsulant 130. For example, the chemical slurry may comprise silicon oxide, aluminum oxide, combinations thereof, or the like. The planarization may further be a timed process with an end point of the planarization process being determined through timing.

After planarization, portions of the polymer material 131 filling pits and other depressions in the top surface of the encapsulant 130 may remain. Further, the planarization process may remove other portions of the polymer material 131 such that areas of the encapsulant 130 (e.g., area 130C in FIG. 8B) is exposed. For example, after planarization, topmost surfaces of the polymer material 131, the encapsulant 130, the integrated circuit dies 114A/114B, and the through vias 112 may be substantially coplanar. Further, after planarization, a thickness of the polymer material 131 may vary and may be in the range of 0 µm to about 0.1 µm across a top surface of the encapsulant 130. Further, the planarization process may result in an CMP residue (e.g., residue 133, also referred to as impurity 133) remaining on the top surface of the polymer material 131 and/or the encapsulant 130. The CMP residue (also referred to as an impurity) is a different material than the polymer material 131, and the CMP residue may comprise a material of the chemical slurry used during the CMP. For example, when the chemical slurry comprises silicon oxide, aluminum oxide, combinations thereof, or the like, the CMP residue may likewise comprise molecules of silicon, aluminum, oxygen, combinations thereof, or the like.

In FIGS. 9A through 19, a front-side redistribution structure 160 is formed. As will be illustrated in FIG. 20, the front-side redistribution structure 160 includes dielectric layers 132, 140, 148, and 156 and metallization patterns 138, 146, and 154 (sometimes referred to as redistribution layers 138, 146, and 154 or redistribution lines 138, 146, and 154).

Figure 9A:
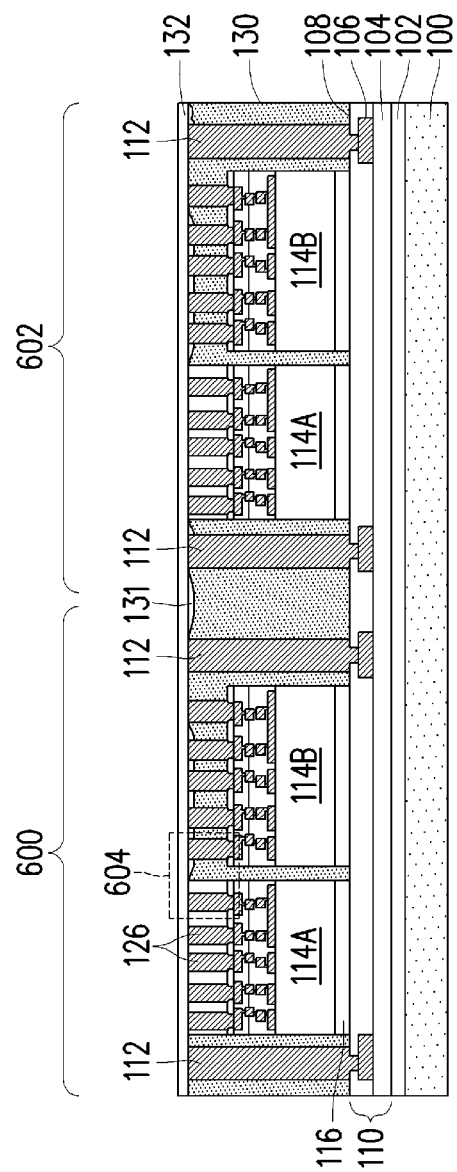
Figure 9B:
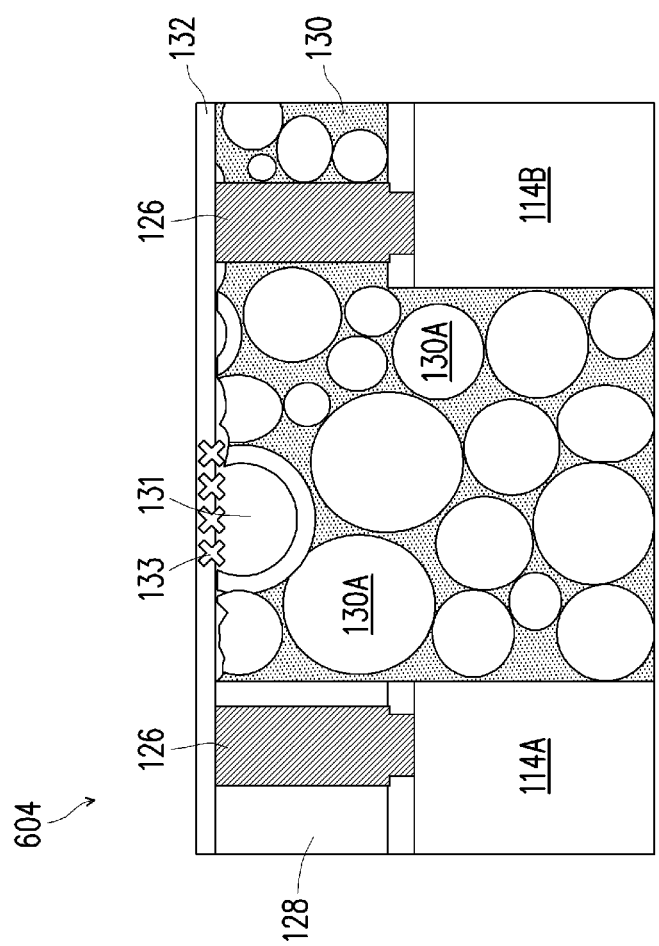

In FIGS. 9A and 9B, the dielectric layer 132 is deposited on the encapsulant 130, the polymer material 131, through vias 112, and die connectors 126. FIG. 9B illustrates a detailed cross-sectional view of region 604 in FIG. 9A. In some embodiments, the dielectric layer 132 is formed of a polymer, which may be a photo-sensitive material such as PBO, polyimide, BCB, or the like, that may be patterned using a lithography mask. In other embodiments, the dielectric layer 132 is formed of a nitride such as silicon nitride; an oxide such as silicon oxide, PSG, BSG, BPSG; or the like. A material composition of the dielectric layer 132 and the polymer material 131 may be the same or different. The dielectric layer 132 may be formed by spin coating, lamination, CVD, the like, or a combination thereof. The dielectric layer 132 may form interfaces with the polymer material 131 and/or the encapsulant 130. Further, in some embodiments, the CMP residue (e.g., residue 133) may be disposed at the interface between the dielectric layer 132 and the polymer material 131 and/or at the interface between the dielectric layer 132 and the encapsulant 130 (not explicitly illustrated). By including the polymer material 131 to fill depressions in the top surface of the encapsulant 130, the dielectric material 132 is formed on a surface with improved planarity, which results in a top surface of the dielectric material 132 also having a relatively planar topography.

Figure 10A:
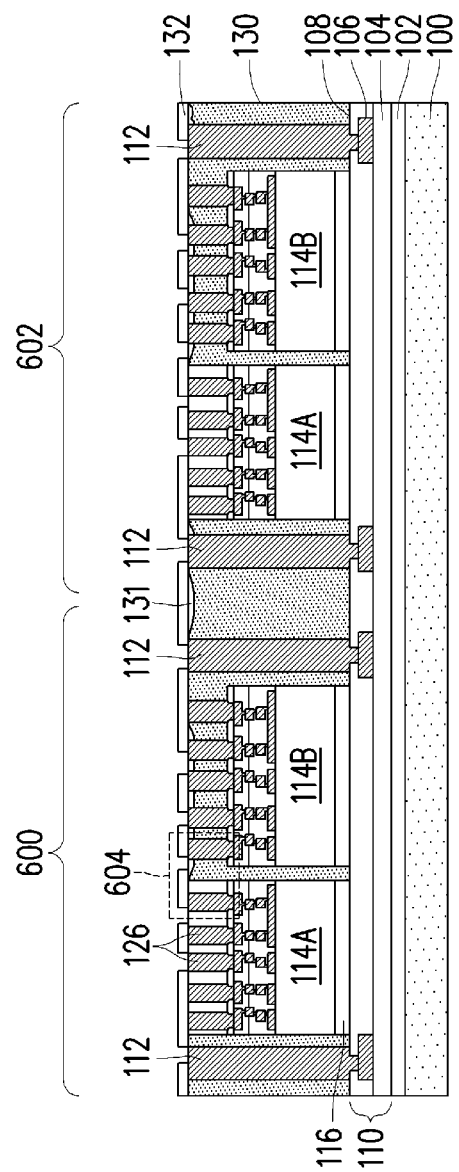

In FIGS. 10A and 10B, the dielectric layer 132 is then patterned. The patterning forms openings to expose portions of the through vias 112 and the die connectors 126. FIG. 10B illustrates a detailed cross-sectional view of region 604 in FIG. 10A. The patterning may be by an acceptable process, such as by exposing the dielectric layer 132 to light when the dielectric layer 132 is a photo-sensitive material or by etching using, for example, an anisotropic etch. If the dielectric layer 132 is a photo-sensitive material, the dielectric layer 132 can be developed (e.g., cured through annealing) after the exposure.

Figure 11A:
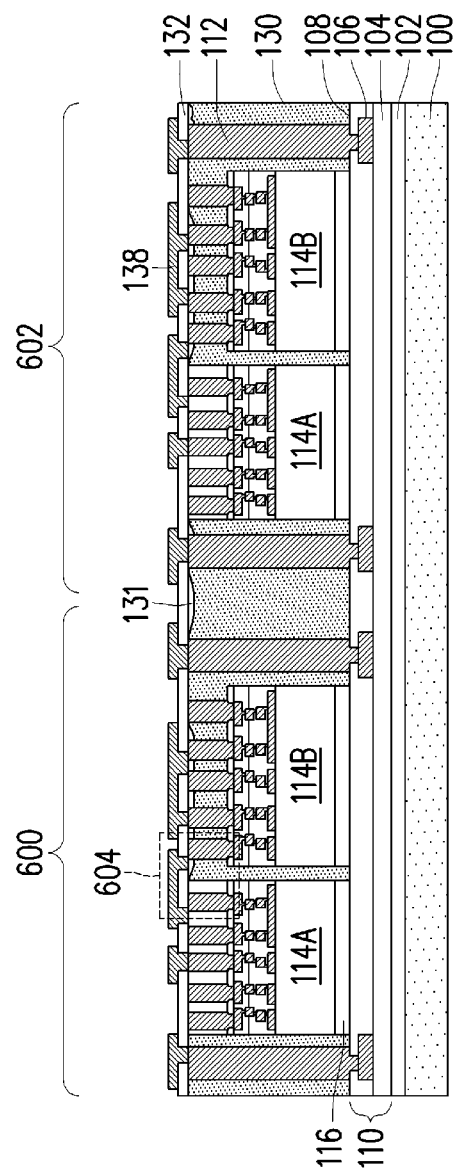
Figure 11B:
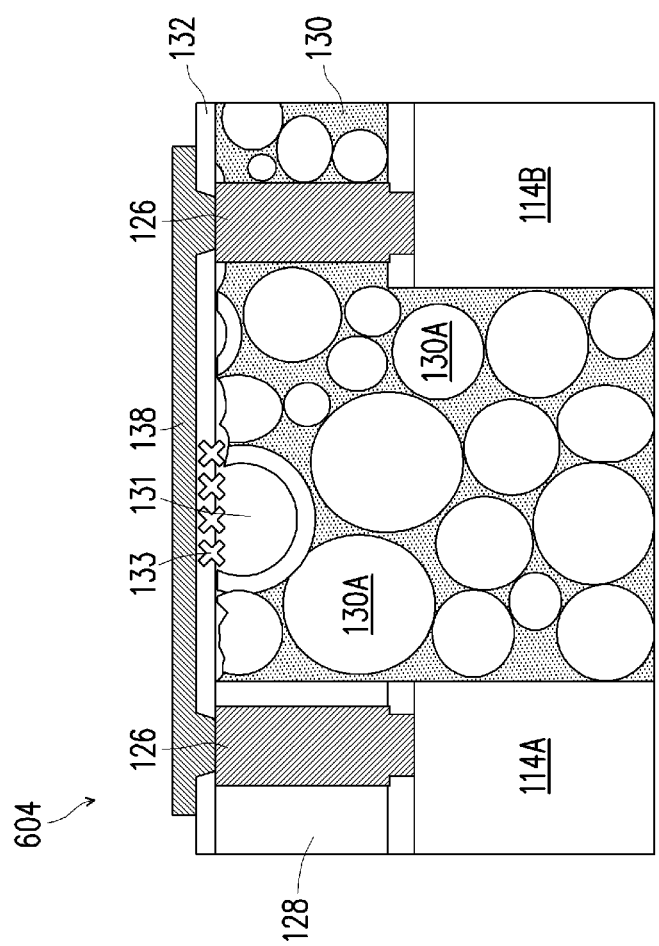

In FIGS. 11A and 11B, metallization pattern 138 with vias is formed on the dielectric layer 132. FIG. 11B illustrates a detailed cross-sectional view of region 604 in FIG. 11A. As an example to form metallization pattern 138, a seed layer (not shown) is formed over the dielectric layer 132 and in openings through the dielectric layer 132. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 138. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 138 and vias. The vias are formed in openings through the dielectric layer 132 to, e.g., the through vias 112 and/or the die connectors 126. In some embodiments, the metallization pattern 138 are fine-pitched redistribution lines having a line width of, for example, 5 µm or less. In other embodiments, the metallization pattern 138 may have other dimensions. By including the polymer material 131 to fill depressions in the top surface of the encapsulant 130, the metallization pattern 138 may be formed on the relatively flat top surface of the dielectric layer 132. As a result, manufacturing defects in the metallization pattern 138 (e.g., broken and/or merged conductive lines) may be advantageously reduced.

Figure 12:
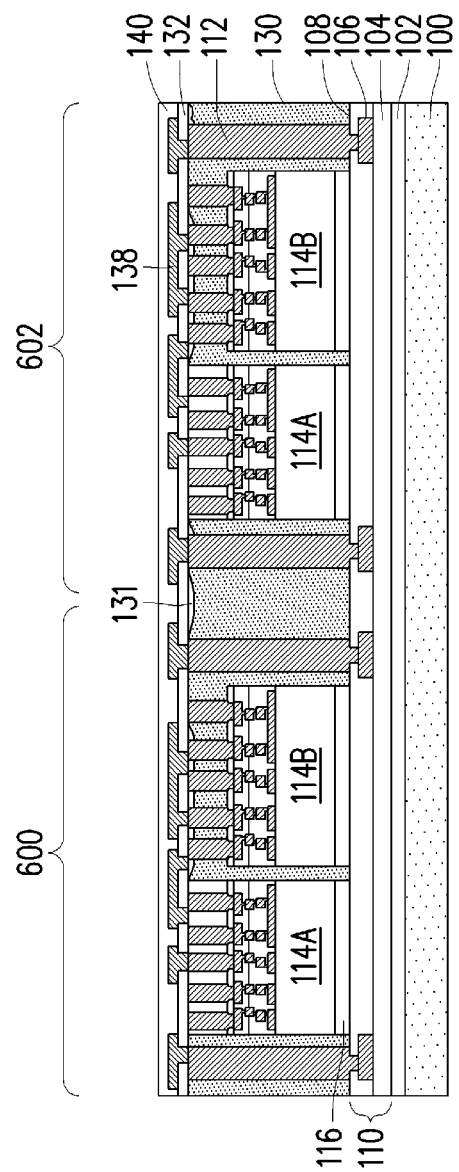

In FIG. 12, the dielectric layer 140 is deposited on the metallization pattern 138 and the dielectric layer 132. In some embodiments, the dielectric layer 140 is formed of a polymer, which may be a photo-sensitive material such as PBO, polyimide, BCB, or the like, that may be patterned using a lithography mask. In other embodiments, the dielectric layer 140 is formed of a nitride such as silicon nitride; an oxide such as silicon oxide, PSG, BSG, BPSG; or the like. The dielectric layer 140 may be formed by spin coating, lamination, CVD, the like, or a combination thereof.

Figure 13:
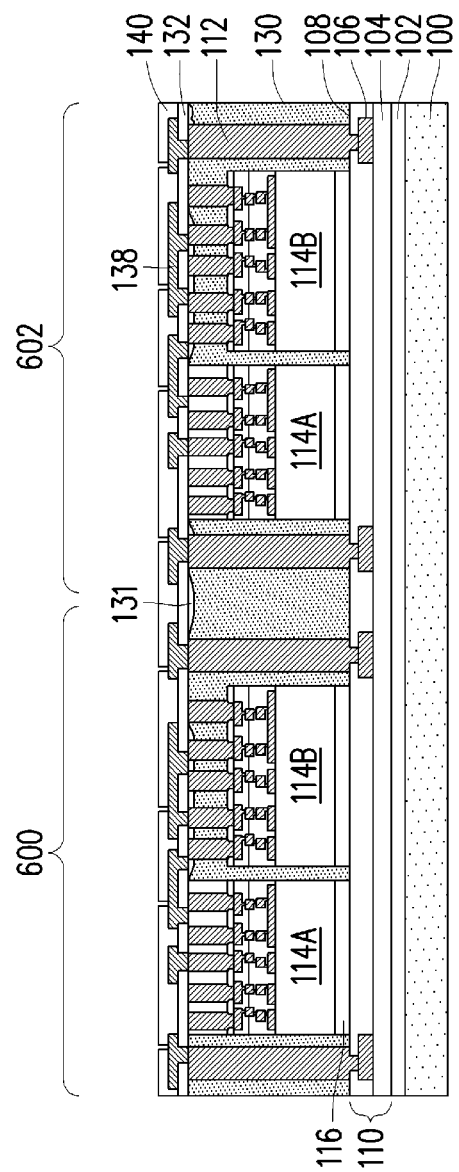

In FIG. 13, the dielectric layer 140 is then patterned. The patterning forms openings to expose portions of the metallization pattern 138. The patterning may be by an acceptable process, such as by exposing the dielectric layer 140 to light when the dielectric layer is a photo-sensitive material or by etching using, for example, an anisotropic etch. If the dielectric layer 140 is a photo-sensitive material, the dielectric layer 140 can be developed after the exposure.

Figure 14:
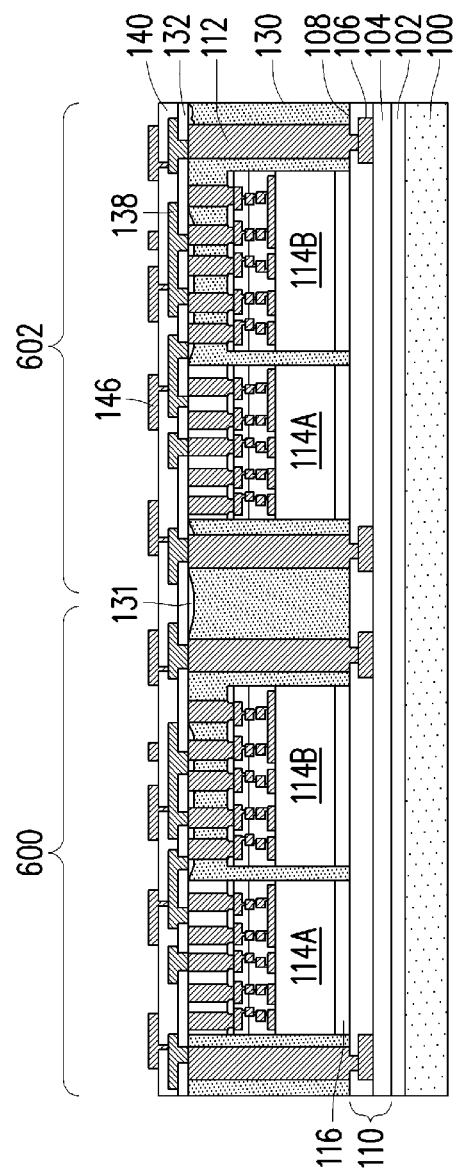

In FIG. 14, metallization pattern 146 with vias is formed on the dielectric layer 140. As an example to form metallization pattern 146, a seed layer (not shown) is formed over the dielectric layer 140 and in openings through the dielectric layer 140. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 146. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 146 and vias. The vias are formed in openings through the dielectric layer 140 to, e.g., portions of the metallization pattern 138.

Figure 15:
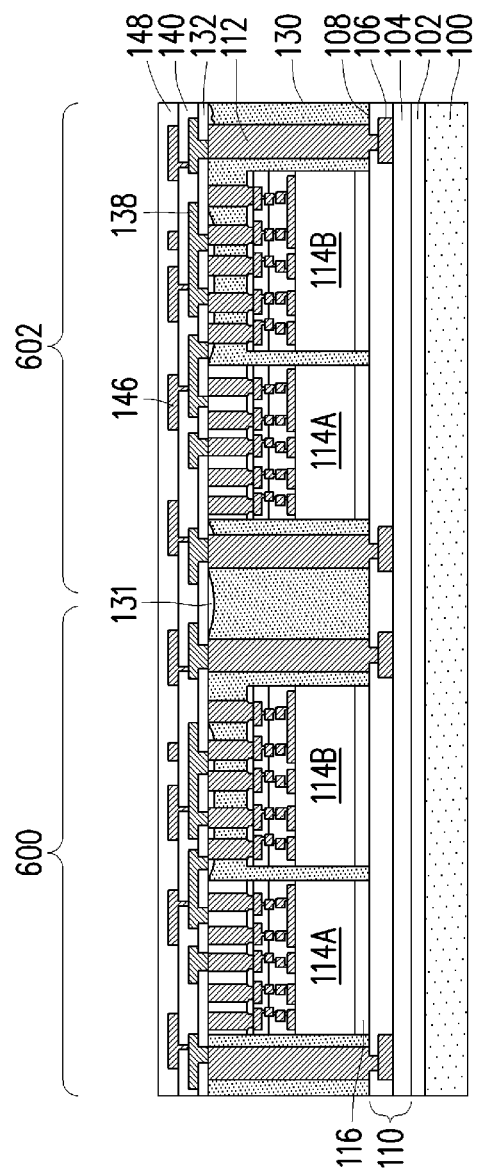

In FIG. 15, the dielectric layer 148 is deposited on the metallization pattern 146 and the dielectric layer 140. In some embodiments, the dielectric layer 148 is formed of a polymer, which may be a photo-sensitive material such as PBO, polyimide, BCB, or the like, that may be patterned using a lithography mask. In other embodiments, the dielectric layer 148 is formed of a nitride such as silicon nitride; an oxide such as silicon oxide, PSG, BSG, BPSG; or the like. The dielectric layer 148 may be formed by spin coating, lamination, CVD, the like, or a combination thereof.

Figure 16:
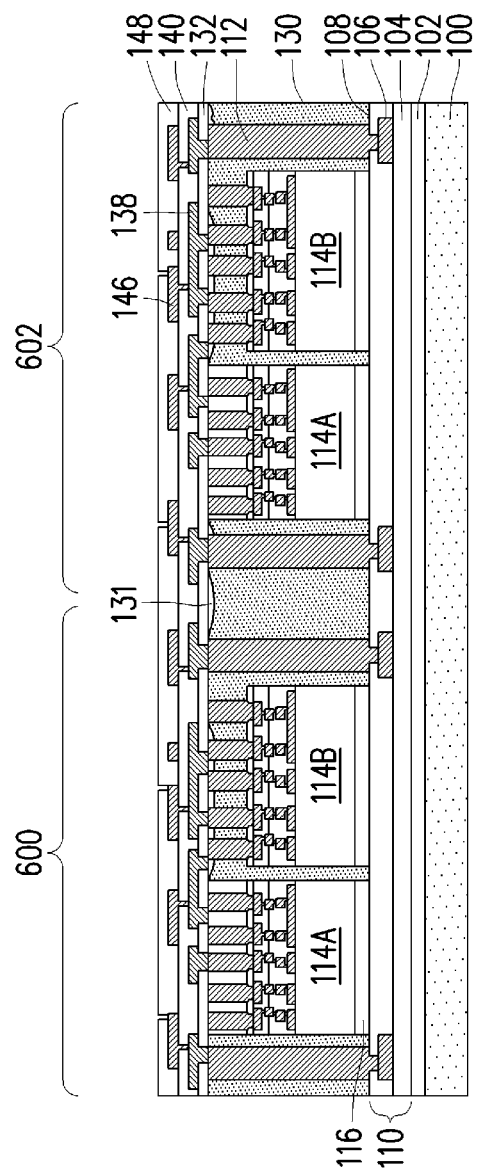

In FIG. 16, the dielectric layer 148 is then patterned. The patterning forms openings to expose portions of the metallization pattern 146. The patterning may be by an acceptable process, such as by exposing the dielectric layer 148 to light when the dielectric layer is a photo-sensitive material or by etching using, for example, an anisotropic etch. If the dielectric layer 148 is a photo-sensitive material, the dielectric layer 148 can be developed after the exposure.

Figure 17:
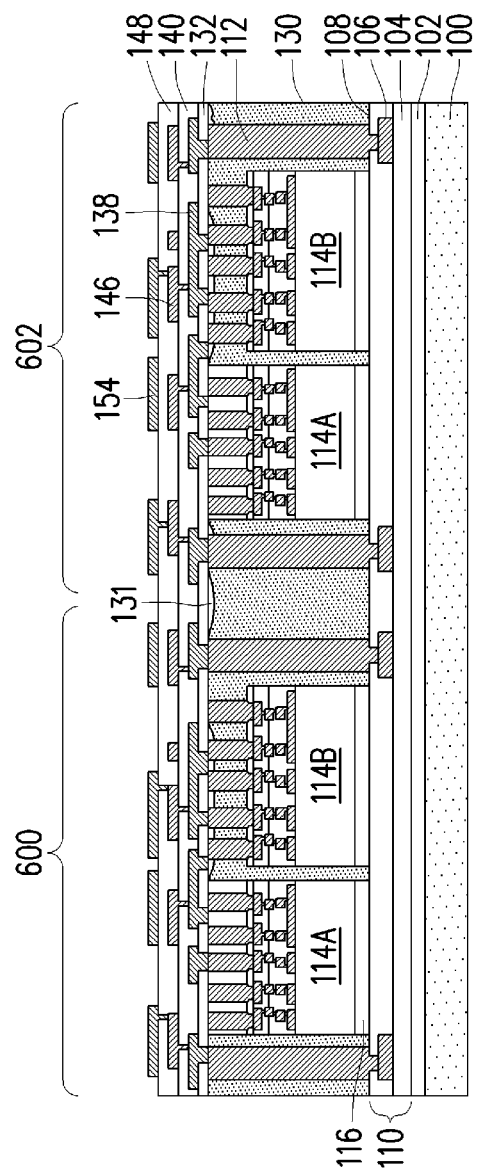

In FIG. 17, metallization pattern 154 with vias is formed on the dielectric layer 148. As an example to form metallization pattern 154, a seed layer (not shown) is formed over the dielectric layer 148 and in openings through the dielectric layer 148. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 154. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 154 and vias. The vias are formed in openings through the dielectric layer 148 to, e.g., portions of the metallization pattern 146.

Figure 18:
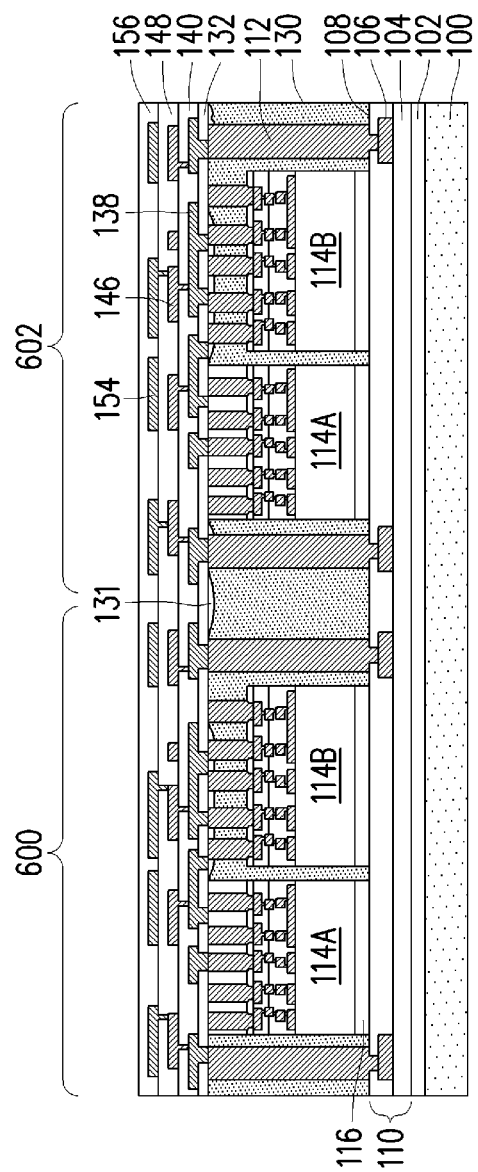

In FIG. 18, the dielectric layer 156 is deposited on the metallization pattern 154 and the dielectric layer 148. In some embodiments, the dielectric layer 156 is formed of a polymer, which may be a photo-sensitive material such as PBO, polyimide, BCB, or the like, that may be patterned using a lithography mask. In other embodiments, the dielectric layer 156 is formed of a nitride such as silicon nitride; an oxide such as silicon oxide, PSG, BSG, BPSG; or the like. The dielectric layer 156 may be formed by spin coating, lamination, CVD, the like, or a combination thereof.

Figure 19:
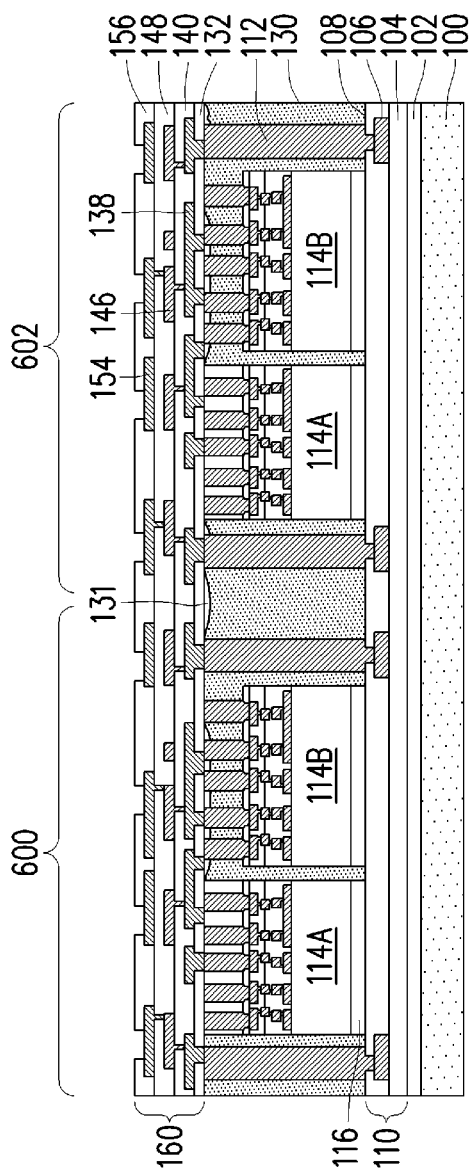

In FIG. 19, the dielectric layer 156 is then patterned. The patterning forms openings to expose portions of the metallization pattern 154. The patterning may be by an acceptable process, such as by exposing the dielectric layer 156 to light when the dielectric layer is a photo-sensitive material or by etching using, for example, an anisotropic etch. If the dielectric layer 156 is a photo-sensitive material, the dielectric layer 156 can be developed after the exposure.

The front-side redistribution structure 160 is shown as an example. More or fewer dielectric layers and metallization patterns may be formed in the front-side redistribution structure 160. If fewer dielectric layers and metallization patterns are to be formed, steps and process discussed above may be omitted. If more dielectric layers and metallization patterns are to be formed, steps and processes discussed above may be repeated. One having ordinary skill in the art will readily understand which steps and processes would be omitted or repeated.

Figure 20:
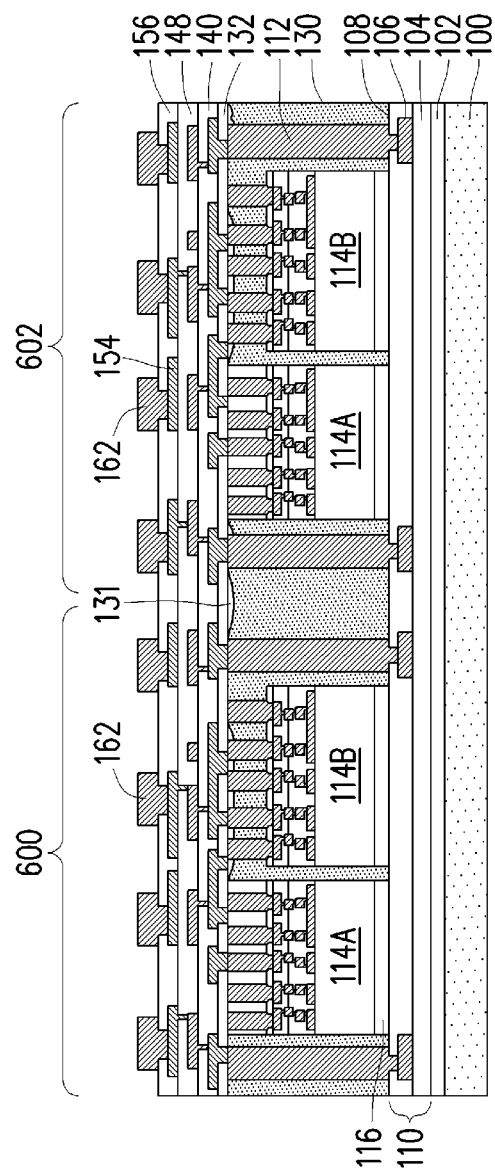

In FIG. 20, pads 162 are formed on an exterior side of the front-side redistribution structure 160. The pads 162 are used to couple to conductive connectors 166 (see FIG. 21) and may be referred to as under bump metallurgies (UBMs) 162 or conductive pillars 162 (see FIG. 25B). In the illustrated embodiment, the pads 162 are formed through openings through the dielectric layer 156 to the metallization pattern 154. As an example to form the pads 162, a seed layer (not shown) is formed over the dielectric layer 156. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the pads 162. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the pads 162. In the embodiment, where the pads 162 are formed differently, more photo resist and patterning steps may be utilized.

Figure 21:
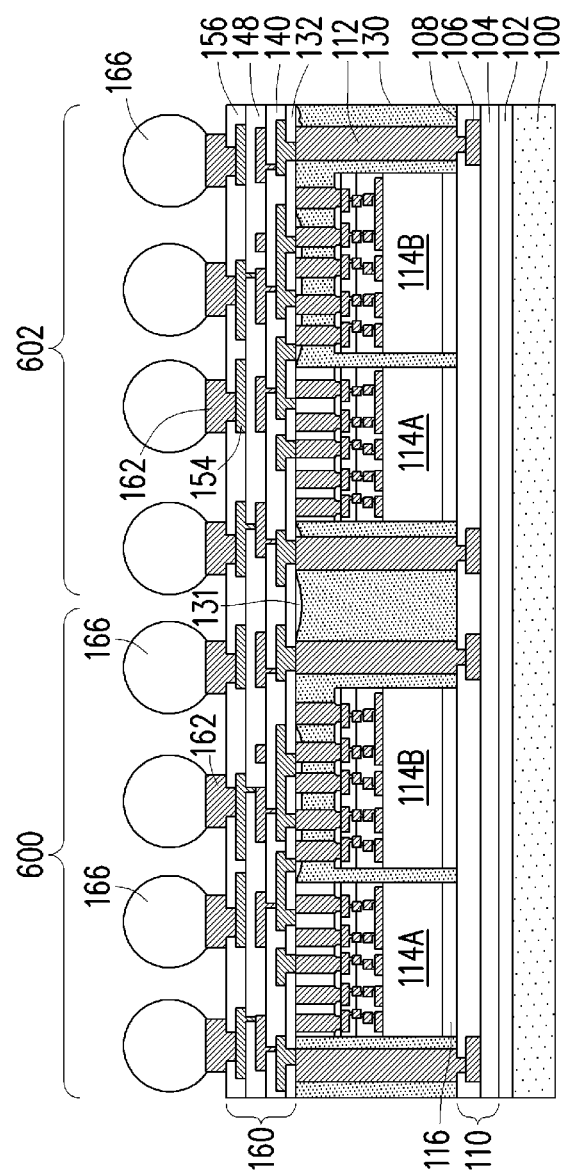

In FIG. 21, conductive connectors 166 are formed on the UBMs 162. The conductive connectors 166 may be BGA connectors, solder balls, solder caps, metal pillars, controlled collapse chip connection (C4) bumps, micro bumps, electroless nickel-electroless palladium-immersion gold technique (ENEPIG) formed bumps, or the like. The conductive connectors 166 may include a conductive material such as solder, copper, aluminum, gold, nickel, silver, palladium, tin, the like, or a combination thereof. In some embodiments, the conductive connectors 166 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 166 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the metal pillar connectors 166. The metal cap layer may include nickel, tin, tin-lead, gold, silver, palladium, indium, nickel-palladium-gold, nickel-gold, the like, or a combination thereof and may be formed by a plating process.

Figure 22:
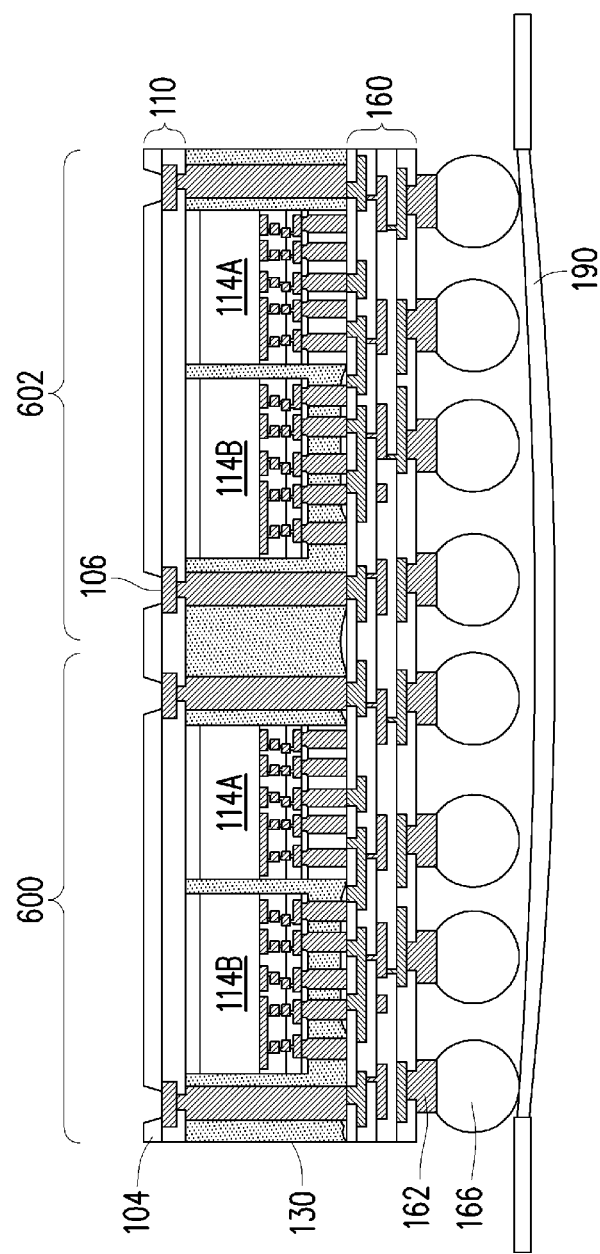

In FIG. 22, a carrier substrate de-bonding is performed to detach (de-bond) the carrier substrate 100 from the back-side redistribution structure, e.g., dielectric layer 104. In accordance with some embodiments, the de-bonding includes projecting a light such as a laser light or an UV light on the release layer 102 so that the release layer 102 decomposes under the heat of the light and the carrier substrate 100 can be removed. The structure is then flipped over and placed on a tape 190.

As further illustrated in FIG. 22, openings are formed through the dielectric layer 104 to expose portions of the metallization pattern 106. The openings may be formed, for example, using laser drilling, etching, or the like.

Figure 23:
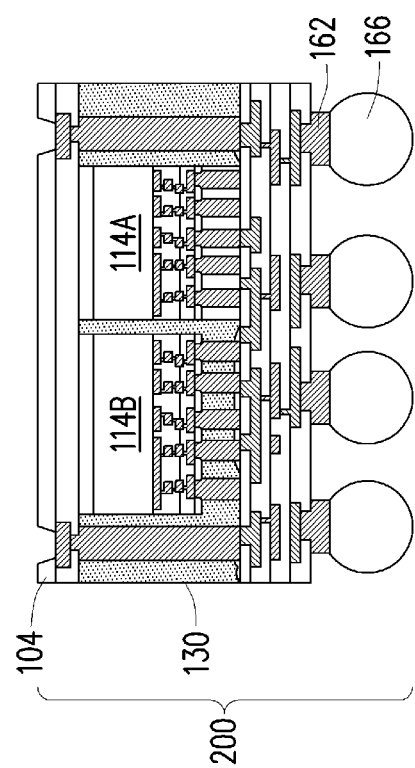

In FIG. 23, a singulation process is performed by sawing 184 along scribe line regions e.g., between adjacent regions 600 and 602. The sawing 184 singulates the first package region 600 from the second package region 602.

FIG. 23 illustrates a resulting, singulated package 200, which may be from one of the first package region 600 or the second package region 602. The package 200 may also be referred to as an integrated fan-out (InFO) package 200.

Figure 24:
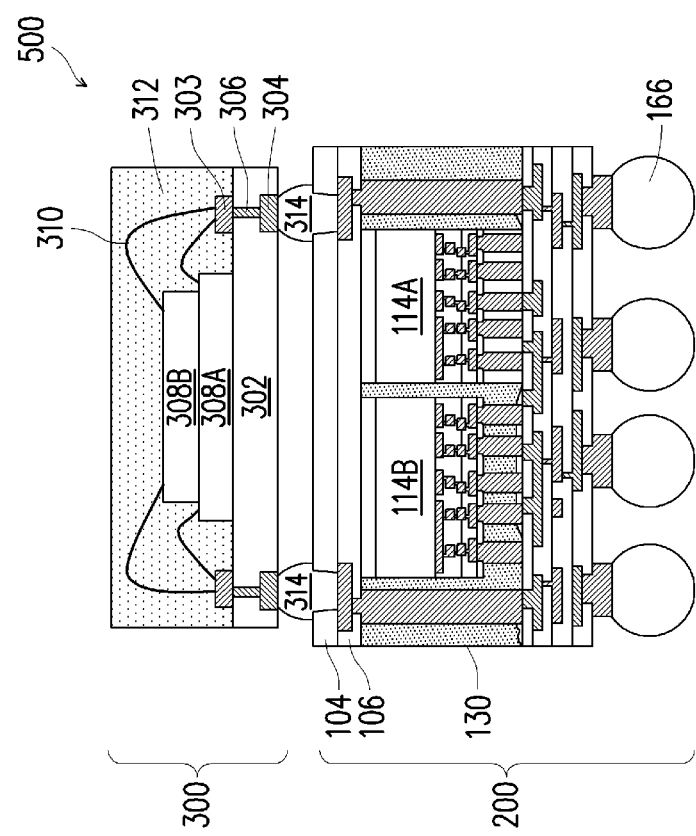

FIG. 24 illustrates a package structure 500 including the package 200 (may be referred to as a first package 200) and an optional second package 300. The second package 300 includes a substrate 302 and one or more stacked dies 308 (308A and 308B) coupled to the substrate 302. The substrate 302 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 302 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 302 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate 302.

The substrate 302 may include active and passive devices (not shown in FIG. 21). As one of ordinary skill in the art will recognize, a wide variety of devices such as transistors, capacitors, resistors, combinations of these, and the like may be used to generate the structural and functional requirements of the design for the semiconductor package 300. The devices may be formed using any suitable methods.

The substrate 302 may also include metallization layers (not shown) and through vias 306. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate 302 is substantially free of active and passive devices.

The substrate 302 may have bond pads 303 on a first side the substrate 202 to couple to the stacked dies 308, and bond pads 304 on a second side of the substrate 302, the second side being opposite the first side of the substrate 302, to couple to the functional connectors 314. In some embodiments, the bond pads 303 and 304 are formed by forming recesses (not shown) into dielectric layers (not shown) on the first and second sides of the substrate 302. The recesses may be formed to allow the bond pads 303 and 304 to be embedded into the dielectric layers. In other embodiments, the recesses are omitted as the bond pads 303 and 304 may be formed on the dielectric layer. In some embodiments, the bond pads 303 and 304 include a thin seed layer (not shown) made of copper, titanium, nickel, gold, palladium, the like, or a combination thereof. The conductive material of the bond pads 303 and 304 may be deposited over the thin seed layer. The conductive material may be formed by an electro-chemical plating process, an electroless plating process, CVD, ALD, PVD, the like, or a combination thereof. In an embodiment, the conductive material of the bond pads 303 and 304 is copper, tungsten, aluminum, silver, gold, the like, or a combination thereof.

In an embodiment, the bond pads 303 and 304 are UBMs that include three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBMs 303 and 304. Any suitable materials or layers of material that may be used for the UBMs 303 and 304 are fully intended to be included within the scope of the current application. In some embodiments, the through vias 306 extend through the substrate 302 and couple at least one bond pad 303 to at least one bond pad 304.

In the illustrated embodiment, the stacked dies 308 are coupled to the substrate 302 by wire bonds 310, although other connections may be used, such as conductive bumps. In an embodiment, the stacked dies 308 are stacked memory dies. For example, the stacked memory dies 308 may include low-power (LP) double data rate (DDR) memory modules, such as LPDDR1, LPDDR2, LPDDR3, LPDDR4, or the like memory modules.

In some embodiments, the stacked dies 308 and the wire bonds 310 may be encapsulated by a molding material 312. The molding material 312 may be molded on the stacked dies 308 and the wire bonds 310, for example, using compression molding. In some embodiments, the molding material 312 is a molding compound, a polymer, an epoxy, silicon oxide filler material, the like, or a combination thereof. A curing step may be performed to cure the molding material 312, wherein the curing may be a thermal curing, a UV curing, the like, or a combination thereof.

In some embodiments, the stacked dies 308 and the wire bonds 310 are buried in the molding material 312, and after the curing of the molding material 312, a planarization step, such as a grinding, is performed to remove excess portions of the molding material 312 and provide a substantially planar surface for the second packages 300.

After the second packages 300 are formed, the packages 300 are mechanically and electrically bonded to the first packages 200 by way of functional connectors 314, the bond pads 304, and the metallization pattern 106. In some embodiments, the stacked memory dies 308 may be coupled to the integrated circuit dies 114 through the wire bonds 310, the bond pads 303 and 304, through vias 306, the functional connectors 314, and the through vias 112.

The functional connectors 314 may be similar to the conductive connectors 166 described above and the description is not repeated herein, although the functional connectors 314 and the conductive connectors 166 need not be the same. The functional connectors 314 may be disposed on an opposing side of the substrate 302 as the stacked memory dies 308. In some embodiments, a solder resist 318 may also be formed on the side of the substrate 302 opposing the stacked memory dies 308. The functional connectors 314 may be disposed in openings in the solder resist 318 to be electrically and mechanically coupled to conductive features (e.g., the bond pads 304) in the substrate 302. The solder resist 318 may be used to protect areas of the substrate 302 from external damage.

In some embodiments, before bonding the functional connectors 314, the functional connectors 314 are coated with a flux (not shown), such as a no-clean flux. The functional connectors 314 may be dipped in the flux or the flux may be jetted onto the functional connectors 314. In another embodiment, the flux may be applied to the surfaces of the metallization patterns 106.

In some embodiments, the functional connectors 314 may have an optional epoxy flux (not shown) formed thereon before they are reflowed with at least some of the epoxy portion of the epoxy flux remaining after the second package 300 is attached to the first package 200. This remaining epoxy portion may act as an underfill to reduce stress and protect the joints resulting from the reflowing the functional connectors 314.

The bonding between the second package 300 and the first package 200 may be a solder bonding. In an embodiment, the second package 300 is bonded to the first package 200 by a reflow process. During this reflow process, the functional connectors 314 are in contact with the bond pads 304 and the metallization patterns 106 to physically and electrically couple the second package 300 to the first package 200. After the bonding process, an intermetallic compound (IMC, not shown) may form at the interface of the metallization patterns 106 and the functional connectors 314 and also at the interface between the functional connectors 314 and the bond pads 304 (not shown). Although FIGS. 23 and 24 illustrate the second package 300 being bonded to the first package 200 after the first package 200 is singulated, in other embodiments, the second package 300 may be bonded to the first package 200 prior to singulation (e.g., while the first package 200 is part of a package wafer, see FIG. 21). After the second package 300 is bonded to the first package 200, the first package 200 may then be singulated from other packages in the package wafer.

The second package 300 is optional. In other embodiments (e.g., see FIG. 25B), particularly when the back-side RDL 110 and the through vias 112 are omitted, the second package 300 may be omitted as well. In such embodiments, the memory component of the package may be provided by the integrated circuit die 114B, which is molded in the first package 200 along with the integrated circuit die 114A (e.g., a processor die). By encapsulating both the memory component and the processor component in a single encapsulated layer, a form factor of the final package (e.g., package 550 of FIG. 25B) and manufacturing costs may be advantageously reduced.

Figure 25A:
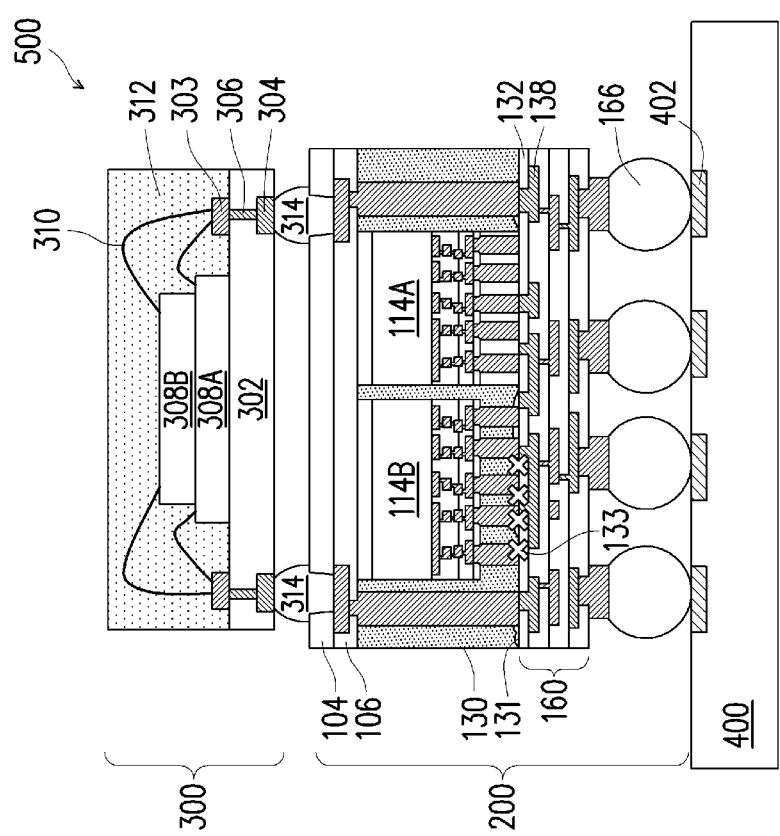

FIG. 25A illustrates the semiconductor package 500 after the packages 200 and 300 being mounted to a substrate 400. The substrate 400 may be referred to a package substrate 400. The package 200 is mounted to the package substrate 400 using the conductive connectors 166.

The package substrate 400 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 400 may be a SOI substrate. Generally, an SOI substrate includes a layer of a semiconductor material such as epitaxial silicon, germanium, silicon germanium, SOI, SGOI, or combinations thereof. The package substrate 400 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for package substrate 400.

The package substrate 400 may include active and passive devices (not shown in FIG. 29). As one of ordinary skill in the art will recognize, a wide variety of devices such as transistors, capacitors, resistors, combinations of these, and the like may be used to generate the structural and functional requirements of the design for the semiconductor package 500. The devices may be formed using any suitable methods.

The package substrate 400 may also include metallization layers and vias (not shown) and bond pads 402 over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 400 is substantially free of active and passive devices.

In some embodiments, the conductive connectors 166 can be reflowed to attach the package 200 to the bond pads 402. The conductive connectors 166 electrically and/or physically couple the substrate 400, including metallization layers in the substrate 400, to the first package 200. In some embodiments, passive devices (e.g., surface mount devices (SMDs), not illustrated) may be attached to the package 200 (e.g., bonded to the bond pads 402) prior to mounting on the substrate 400. In such embodiments, the passive devices may be bonded to a same surface of the package 200 as the conductive connectors 166.

The conductive connectors 166 may have an epoxy flux (not shown) formed thereon before they are reflowed with at least some of the epoxy portion of the epoxy flux remaining after the package 200 is attached to the substrate 400. This remaining epoxy portion may act as an underfill to reduce stress and protect the joints resulting from the reflowing the conductive connectors 166. In some embodiments, an underfill (not shown) may be formed between the first package 200 and the substrate 400 and surrounding the conductive connectors 166. The underfill may be formed by a capillary flow process after the package 200 is attached or may be formed by a suitable deposition method before the package 200 is attached.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 25B:
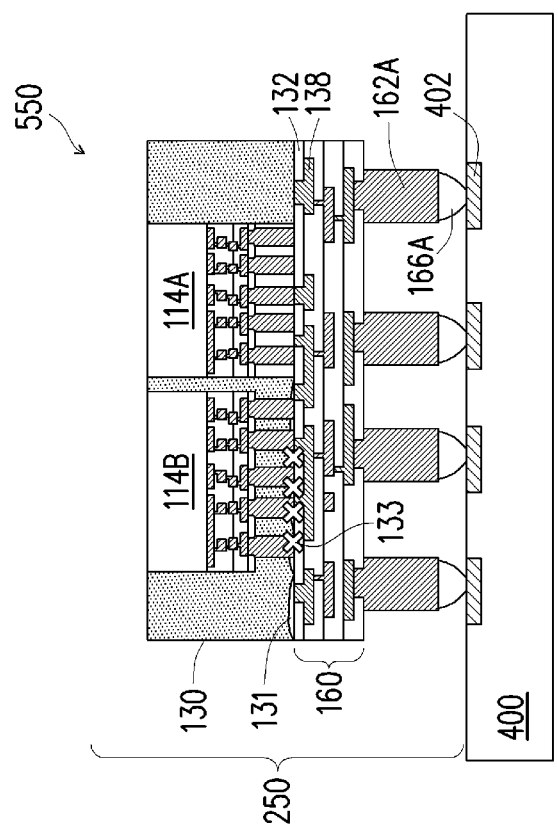

FIG. 25B illustrates a package 550 in accordance with some embodiments. Package 550 includes a first package 250 bonded to a package 400 by connectors 164A and 166A. Connectors 164A and 166A may be BGA balls, C4 bumps, or the like. In some embodiments, connectors 164A and 166A comprise a solder cap 116A disposed on a conductive pillar 164A. Package 550 may be substantially similar to package 500 (see FIG. 25A) where like reference numerals indicate like elements. However, in package 250, the optional back-side RDL 110 and the through vias 112 are omitted. Further, no memory module (e.g., similar to package 300 as illustrated in FIG. 25B) is bonded to an opposing side of the first package 250 as the package 400. In some embodiments, the memory component of package 550 is provided by the integrated circuit die 114B as described above. Although referred to as a "die" the integrated circuit dies 114A and/or 114B may be bare chips or packaged chips (e.g., comprising one or more dies and/or redistribution features).

Figure 26A:
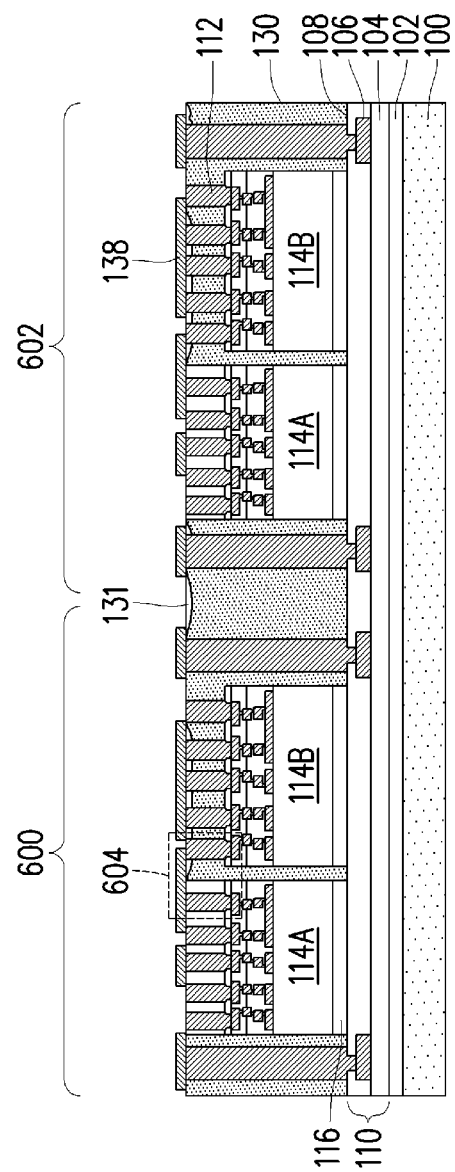
FIGS. 26A, 26B, and 27 illustrate cross-sectional views of intermediate steps during a process for forming a package in accordance with some alternative embodiments.
Figure 26B:
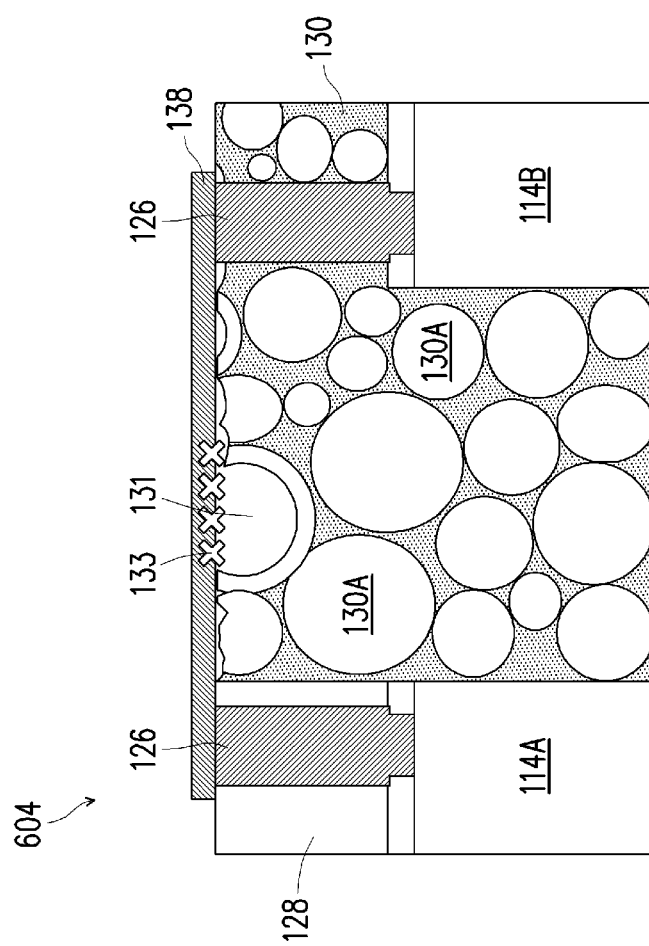
Figure 27:
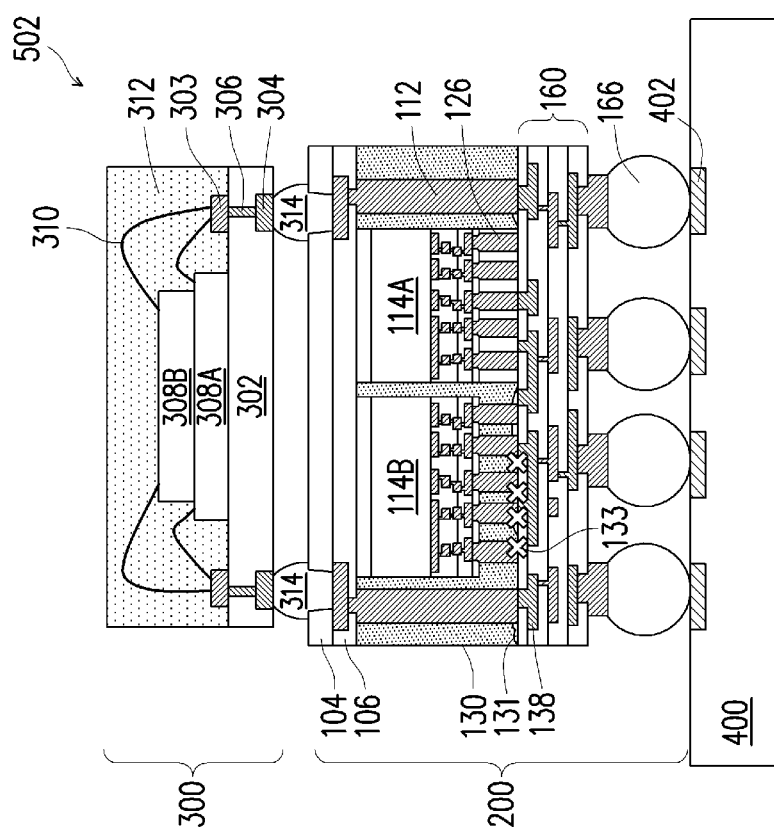

FIGS. 26A through 27 illustrate cross-sectional views of varying stages of manufacturing a package 502 (see FIG. 27) according to alternative embodiments. Referring to FIGS. 26A and 26B, an intermediary process step of forming the package 502 (see FIG. 27) is depicted. FIG. 26B illustrates a detailed cross-sectional view of area 604 of FIG. 26A. Package 502 may be substantially similar to package 500 (see FIG. 25A) where like reference numerals indicate like elements formed using like process steps (e.g., as described above with respect to FIGS. 1 through 11B). Similar to the embodiments described above, the back-side redistribution structure 110 and/or the through vias 112 are optional and may be omitted. However, in package 502, the dielectric layer 132 (see FIGS. 11A and 11B) are omitted, and the metallization pattern 138 is formed directly on the encapsulant 130 and the polymer material 131 to electrically interconnect the die connectors 126 of the integrated circuit die 114A, the die connectors 126 of the integrated circuit die 114B, and the through vias 112. For example, the metallization pattern 138 forms interfaces with the encapsulant 130 and the polymer material 131. Further, a CMP residue from planarizing the polymer material 131 (illustrated as residue 133) may be disposed at the interface between the metallization pattern 138 and the polymer material 131 and/or the interface between the metallization pattern 138 and the encapsulant 130. As discussed above, the CMP residue (also referred to as an impurity) may comprise a material of the chemical slurry used during the CMP of the polymer material 131. For example, when the chemical slurry comprises silicon oxide, aluminum oxide, combinations thereof, or the like, the CMP residue may likewise comprise molecules of silicon, aluminum, oxygen, combinations thereof, or the like. FIG. 27 illustrates the completed package 502 after further processing, for example, by applying like process steps as those discussed above with respect to FIGS. 12 through 25A. In other embodiments (e.g., similar to FIG. 25B), particularly when the optional back-side redistribution structure 110 and the through vias 112 are omitted, the package 300 may be omitted.

Figure 28A:
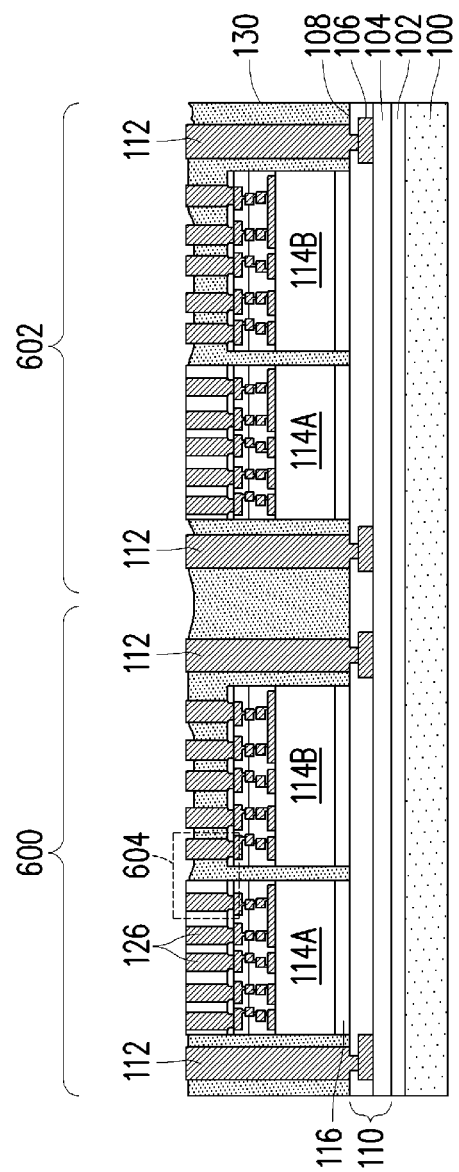

FIGS. 28A through 34B illustrate cross-sectional views of varying stages of manufacturing a package 504 (see FIG. 34A) and/or a package 506 (see FIG. 34B) according to alternative embodiments. Referring to FIGS. 28A and 28B, an intermediary process step of forming the packages 504 and 506 (see FIGS. 34A and 34B) is depicted. FIG. 28B illustrates a detailed cross-sectional view of area 604 of FIG. 28A. The features of FIGS. 28A and 28B may be substantially similar to features illustrated and described above with respect to FIGS. 6A and 6B, where like reference numerals indicate like elements formed using like process steps. Similar to the embodiments described above, the back-side redistribution structure 110 and/or the through vias 112 are optional and may be omitted.

Figure 29A:
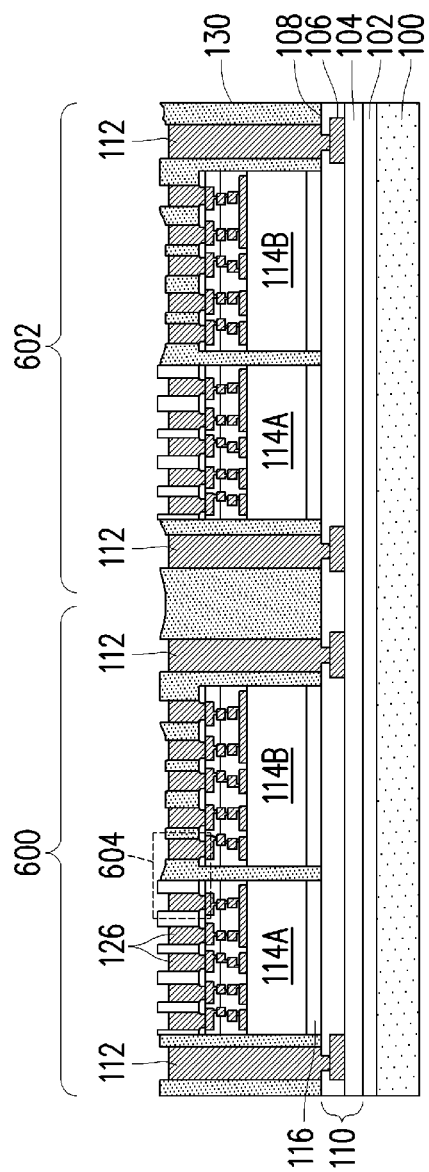
Figure 29B:
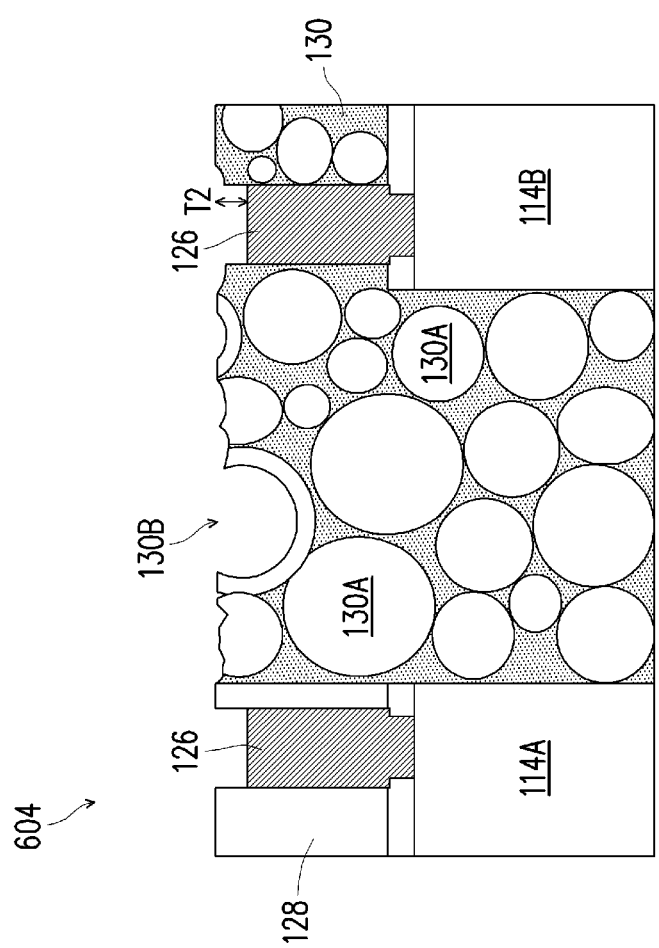

Next, in FIGS. 29A and 29B, the conductive vias 112 and the die connectors 126 are patterned. FIG. 29B illustrates a detailed cross-sectional view of area 604 of FIG. 29A. Patterning the conductive vias 112 and the die connectors 126 may include an etch back process, a desmear process, combinations thereof, or the like to recess the conductive vias 112 and die connectors 126 below top surfaces of the encapsulant 130 and the dielectric material 128. In some embodiments, patterning the conductive vias 112 and the die connectors 126, removes a native oxide (e.g., copper oxide) formed at the top surfaces of the conductive vias 112 and the die connectors 126. It has been observed that by removing this native oxide, conductivity of the conductive vias 112 and the die connectors 126 may be improved. In some embodiments, patterning the conductive vias 112 and the die connectors 126, respective heights of each of the conductive vias 112 and the die connectors 126 are reduced by a thickness T2 (see FIG. 29B), which may be in the range of about 0.1 μm to about 20 μm.

Figure 30A:
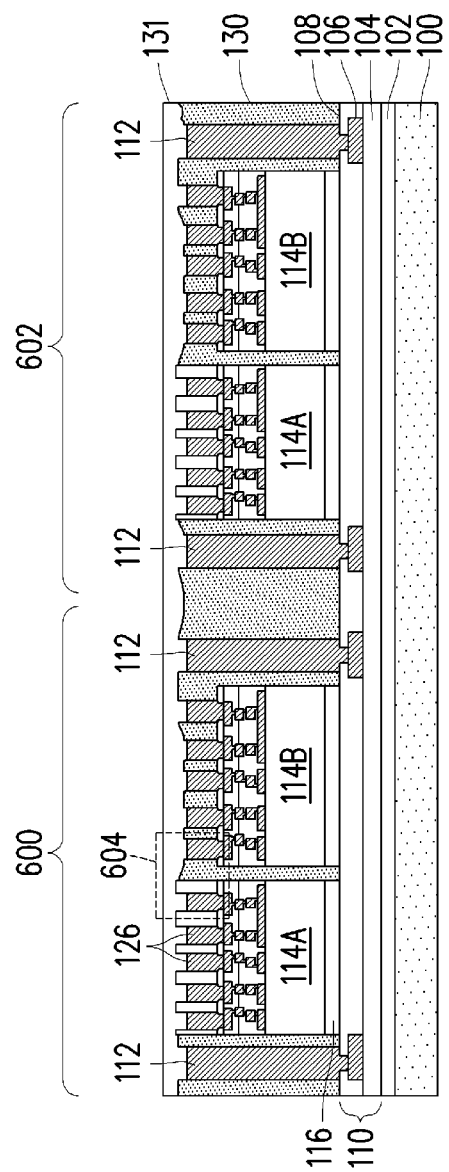
Figure 30B:
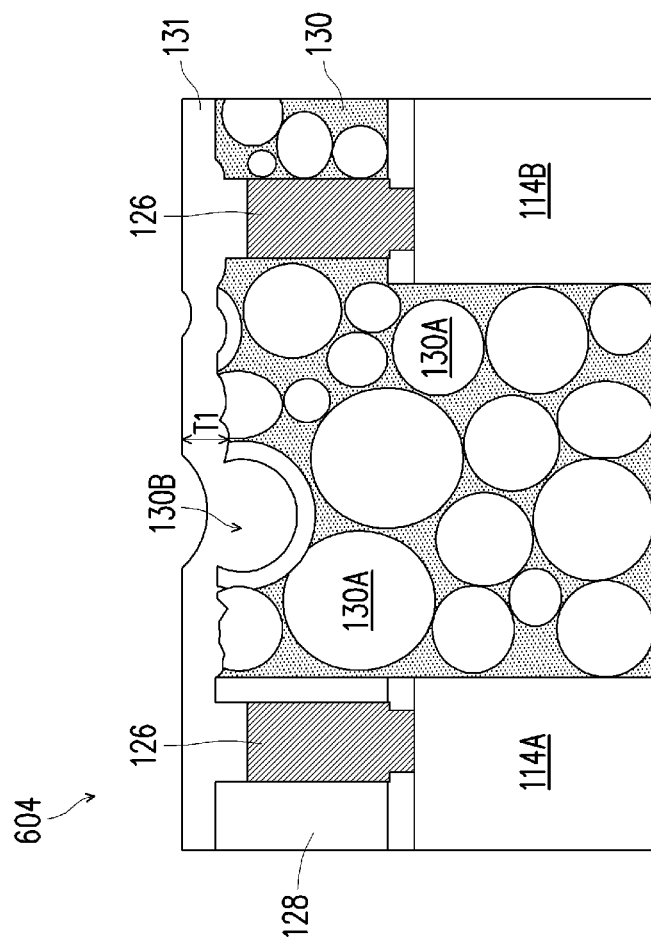

Next, the polymer material 131 is formed on the encapsulant 130 as illustrated by FIG. 30A. FIG. 30B illustrates a detailed cross-sectional view of region 604 in FIG. 30A. The polymer material 131 may comprise PBO, polyimide, BCB, or the like. In some embodiments, the polymer material 131 is a photo-sensitive material. Forming the polymer material 131 may comprise a coating process, such as a spin-on process. The polymer material 131 may be coated to fill pits and other depressions at the top surface of the encapsulant 130. The polymer material 131 may further fill openings defined by the patterning of the conductive vias 112 and the die connectors 126 (see FIGS. 29A/29B). For example, the polymer material 131 may further cover top surfaces of the die connectors 126 and the through vias 112.

Referring to FIG. 30B, the polymer material 131 may fill any exposed hollow cores 130B (see FIG. 28B) of the fillers 130A. The polymer material 131 may be dispensed to a thickness T1 in order to provide sufficient coverage of the uneven topography of the encapsulant 130. In some embodiments, a ratio of thickness T1 of the polymer layer to an average diameter of the fillers 130A to thickness T1 of the polymer layer may be at least about 0.5. In some embodiments, the thickness T1 of the polymer layer is at least 10 μm. In some embodiments, the coating process used to form the polymer material 131 along with the uneven topography of the encapsulant 130 may result in a top surface of the polymer material 131 being non-planar. For example, portions of the top surface of the polymer material 131 directly over exposed hollow cores 130B (see FIG. 28B) may be uneven.

Figure 31A:
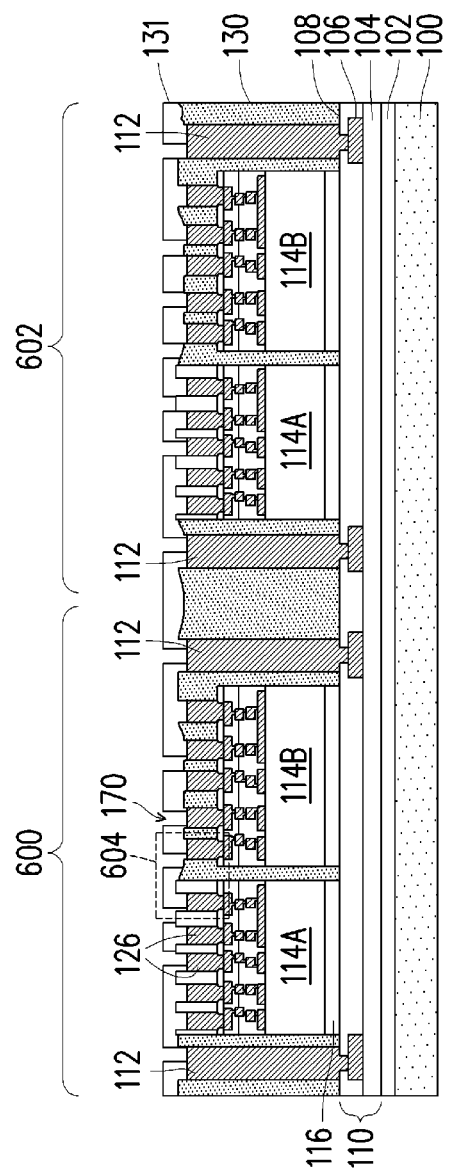
Figure 31B:
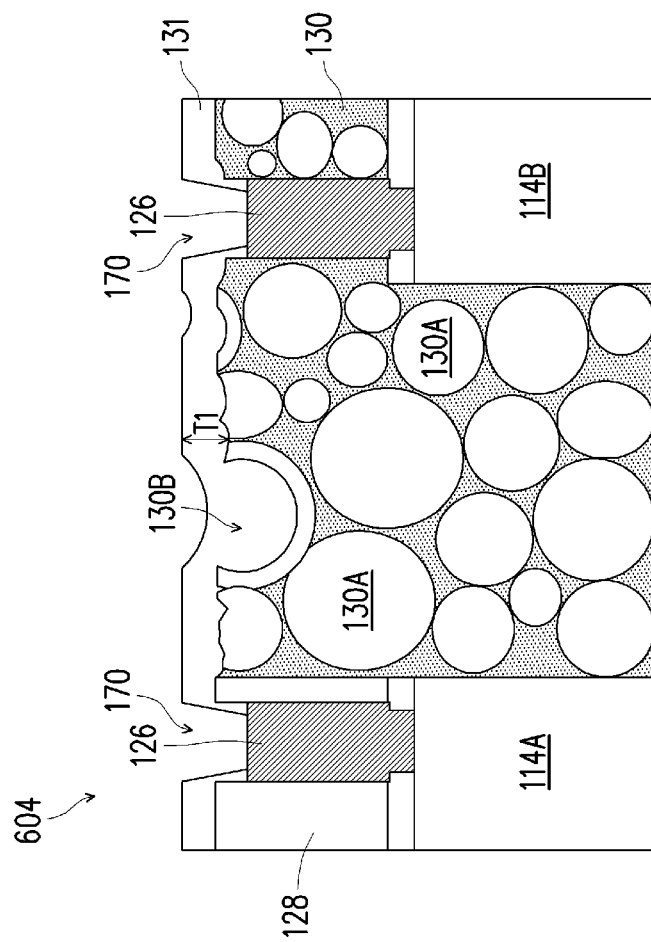

Next, in FIGS. 31A and 31B, openings 170 are patterned in the polymer material 131 to expose the through vias 112 and the die connectors 126. FIG. 31B illustrates a detailed cross-sectional view of region 604 in FIG. 31A. The patterning may be by an acceptable process, such as by exposing the polymer material 131 to light when the dielectric layer is a photo-sensitive material or by etching using, for example, an anisotropic etch.

After patterning, a curing process (e.g., an anneal) may be applied to the polymer material 131. In embodiments where one or more of the integrated circuit dies 114A/114B are temperature sensitive (e.g., memory dies), the polymer material 131 may comprise a low-temperature polymer, which is cured at a relatively low temperature (e.g., less than about 300° C.) so as not to damage the integrated circuit dies 114A/114B. In other embodiments, the polymer material 131 may be cured at any suitable temperature. The curing process may harden the polymer material to allow for a sufficient stiffness for subsequent processing steps (e.g., planarization, see FIGS. 32A, 32B, and 32C). Although the curing process is described as being performed after patterning the polymer material 131, in other embodiments, curing the polymer material 131 may be performed prior to patterning the polymer material 131 (e.g., when an etching process is used to pattern the polymer material 131).

Figure 32A:
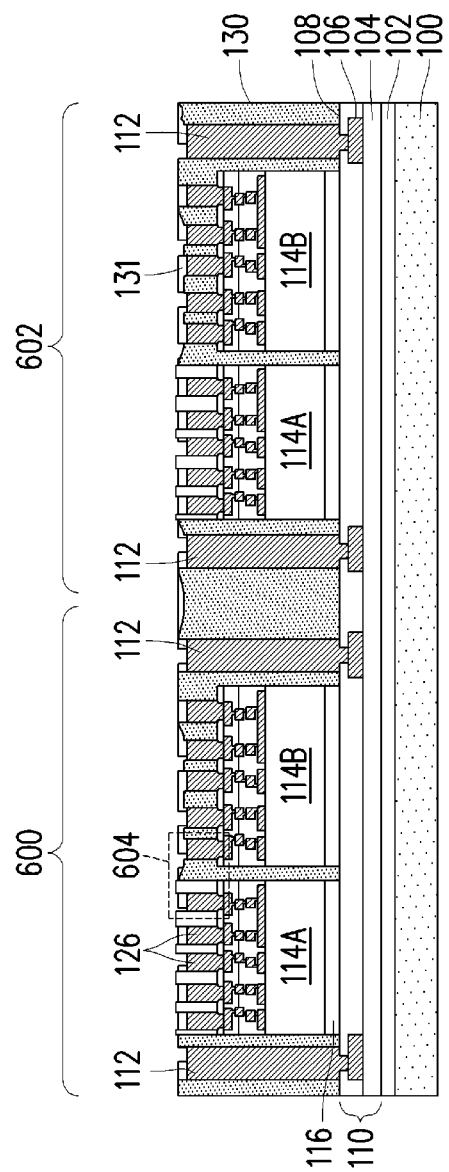
Figure 32B:
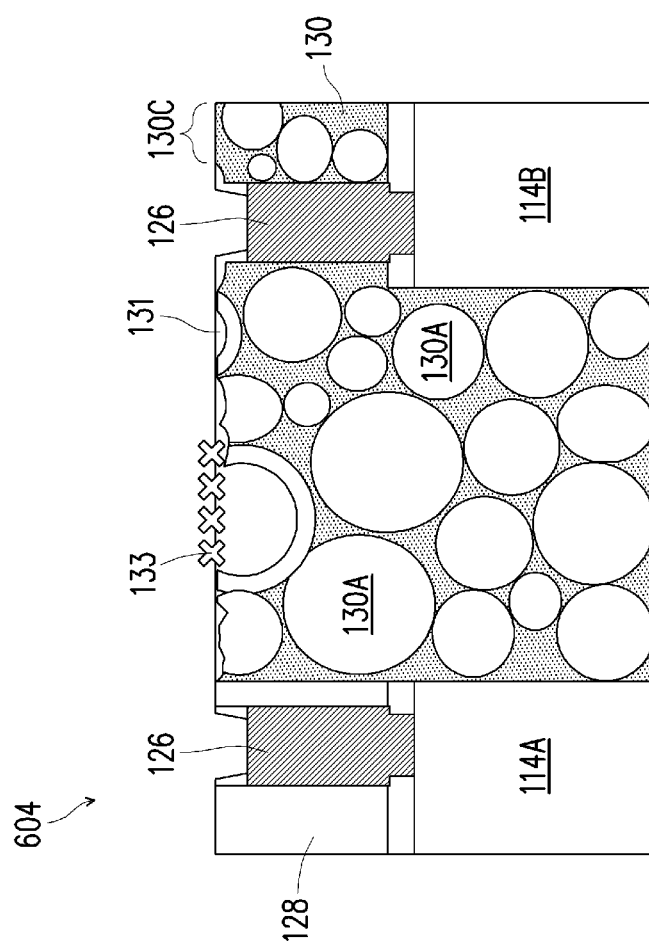
Figure 32C:
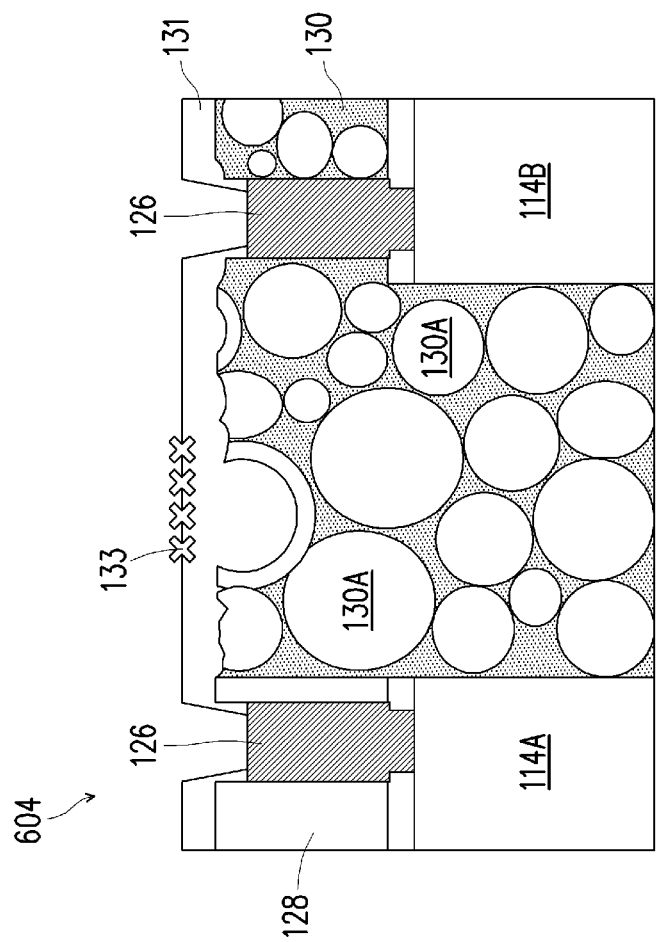

In FIGS. 32A, 32B, and 32C, a planarization process is applied to the polymer material 131. FIGS. 32B and 32C illustrates a detailed cross-sectional view of region 604 in FIG. 32A. FIG. 32B corresponds to a planarization process resulting in the package 504 (see FIG. 34A) in accordance with some embodiments. FIG. 32C corresponds to a planarization process resulting in the package 506 (see FIG. 34B) in accordance with some alternative embodiments.

The planarization process provides a top surface with a high degree of planarity for forming additional features (e.g., metallization patterns) over the encapsulant 130 and the polymer material 131. In some embodiments, the planarization process comprises a CMP using a chemical slurry which selectively removes the polymer material 131 at a higher rate than the encapsulant 130. For example, the chemical slurry may comprise silicon oxide, aluminum oxide, combinations thereof, or the like. The planarization may further be a timed process with an end point of the planarization process being determined through timing.

After planarization, portions of the polymer material 131 filling pits and other depressions in the top surface of the encapsulant 130 may remain. In some embodiments (see FIG. 32B), the planarization process may remove other portions of the polymer material 131 such that areas of the encapsulant 130 (e.g., area 130C in FIG. 32B) is exposed. For example, after planarization, topmost surfaces of the polymer material 131, the encapsulant 130, and the dielectric material 128 may be substantially coplanar. In such embodiments, after planarization, a thickness of the polymer material 131 may vary and may be in the range of 0 µm to about 0.1 µm across a top surface of the encapsulant 130 and the dielectric material 128.

In other embodiment (see FIG. 32C), the planarization process planarizes the polymer material 131 without exposing any portions of the encapsulant 130 or the dielectric material 128. For example, after planarization, the polymer material 131 fully covers top surfaces of the encapsulant 130 and the dielectric material 128. In such embodiments, after planarization, a thickness of the polymer material 131 may vary and may be in the range of 0.1 µm to about 30 µm across a top surface of the encapsulant 130 and the dielectric material 128.

Further, the planarization process may result in an CMP residue (e.g., residue 133, also referred to as impurity 133) remaining on the top surface of the polymer material 131 and/or the encapsulant 130. The CMP residue (also referred to as an impurity) is a different material than the polymer material 131, and the CMP residue and may comprise a material of the chemical slurry used during the CMP. For example, when the chemical slurry comprises silicon oxide, aluminum oxide, combinations thereof, or the like, the CMP residue may likewise comprise molecules of silicon, aluminum, oxygen, combinations thereof, or the like. Further, a material of the CMP residue is not found within a material composition of the polymer material 131.

Figure 33A:
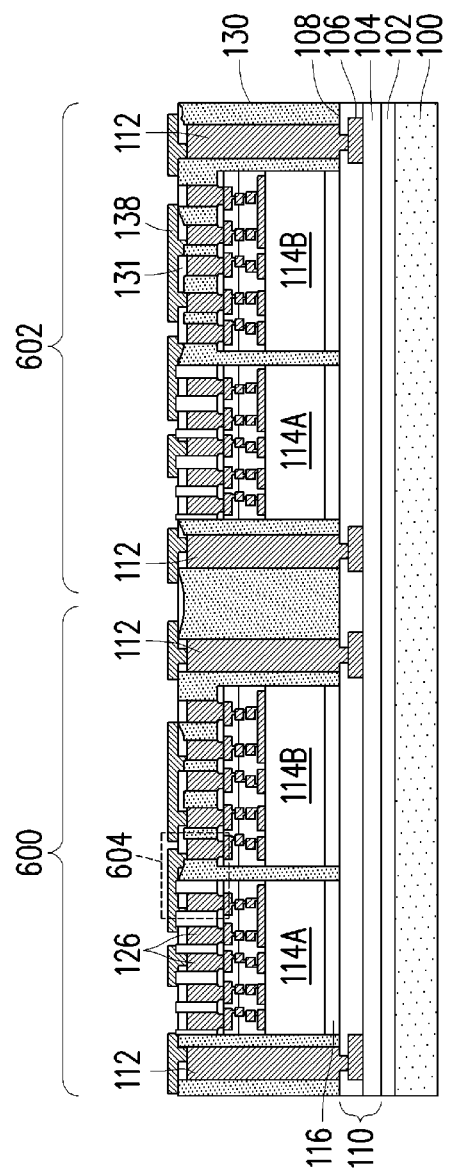
Figure 33B:
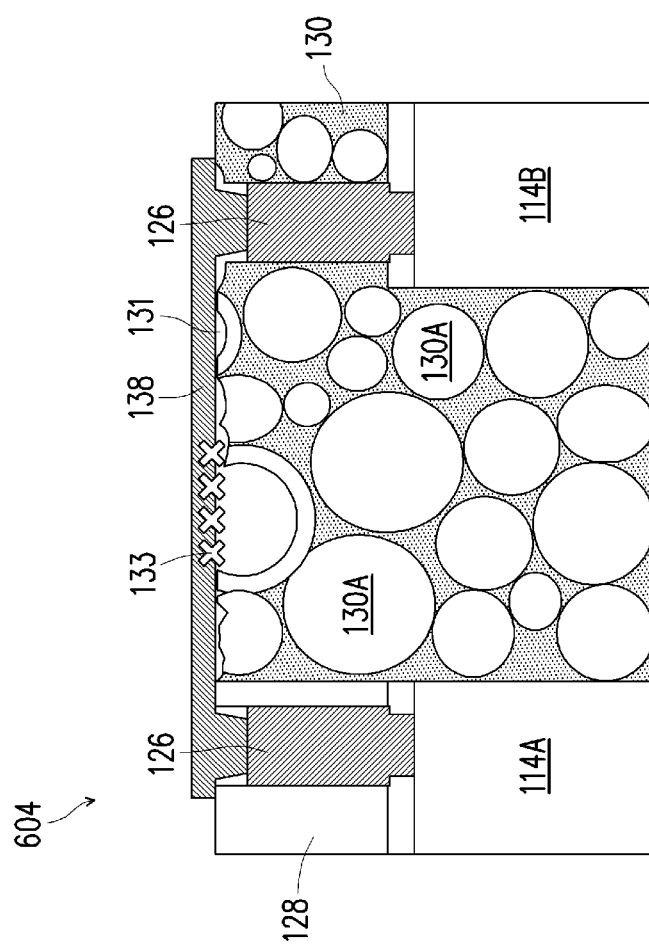
Figure 33C:
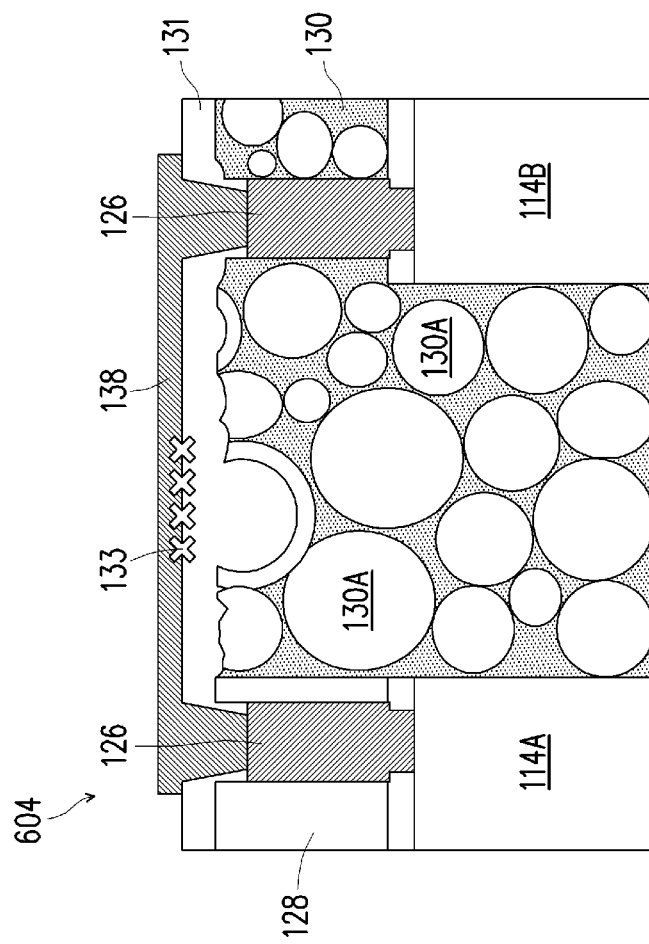

Next, in FIGS. 33A, 33B, and 33C, the metallization pattern 138 is formed directly on the polymer material 131 to electrically interconnect the die connectors 126 of the integrated circuit die 114A, the die connectors 126 of the integrated circuit die 114B, and the through vias 112. FIGS. 33B and 33C illustrates a detailed cross-sectional view of region 604 in FIG. 33A. FIG. 33B corresponds to forming a metallization pattern resulting in the package 504 (see FIG. 34A) in accordance with some embodiments. FIG. 33C corresponds to forming a metallization pattern resulting in the package 506 (see FIG. 34B) in accordance with some alternative embodiments.

Figure 34A:
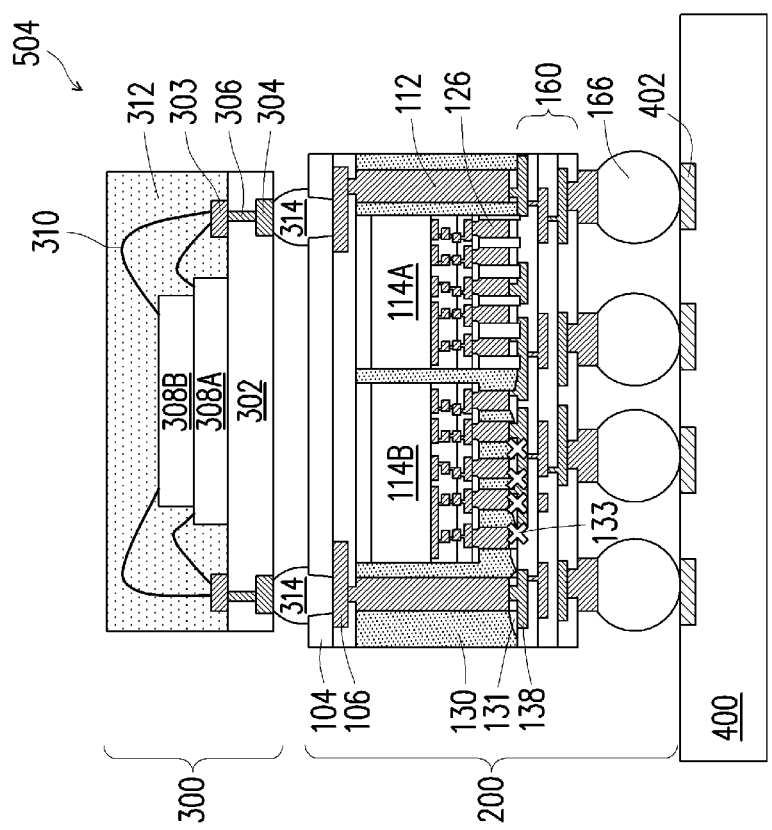

In some embodiments (see FIG. 33B), the metallization pattern 138 forms interfaces with the encapsulant 130, the dielectric material 128, and the polymer material 131. In such embodiments a CMP residue from planarizing the polymer material 131 (illustrated as residue 133) may be disposed at the interface between the metallization pattern 138 and the polymer material 131 and/or the interface between the metallization pattern 138 and the encapsulant 130. As discussed above, the CMP residue may comprise a material of the chemical slurry used during the CMP of the polymer material 131. For example, when the chemical slurry comprises silicon oxide, aluminum oxide, combinations thereof, or the like, the CMP residue may likewise comprise molecules of silicon, aluminum, oxygen, combinations thereof, or the like. FIG. 34A illustrates the completed package 504 after further processing, for example, by applying like process steps as those discussed above with respect to FIGS. 12 through 25A. In other embodiments (e.g., similar to FIG. 25B), particularly when the optional back-side redistribution structure 110 and the through vias 112 are omitted, the package 300 may be omitted.

Figure 34B:
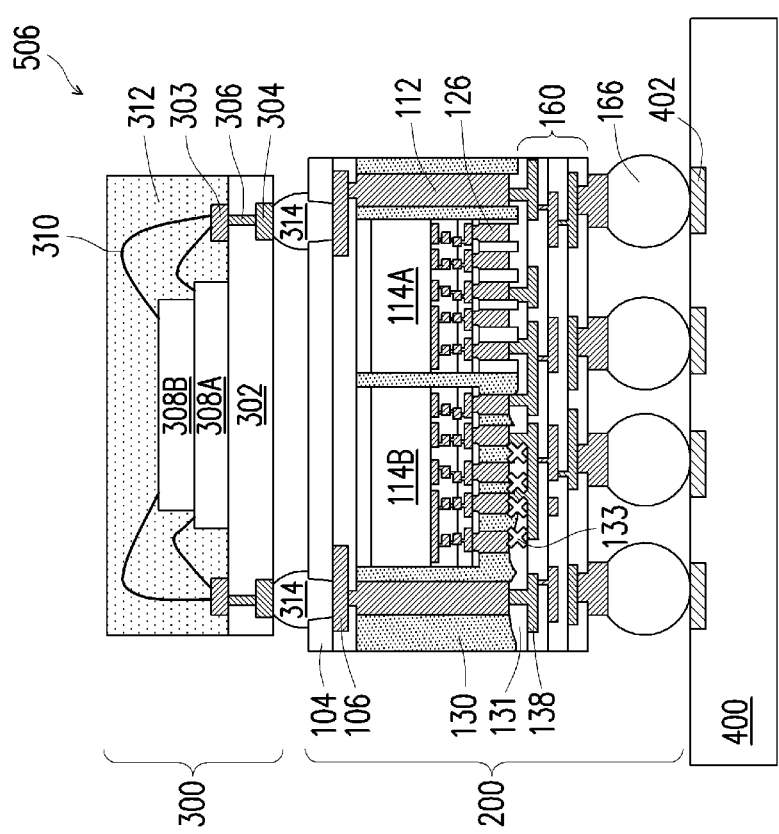

In some embodiments (see FIG. 33C), the metallization pattern 138 forms interfaces with the polymer material 131 without forming interfaces with the encapsulant 130 or the dielectric material 128. In such embodiments a CMP residue from planarizing the polymer material 131 (illustrated as residue 133) may be disposed at the interface between the metallization pattern 138 and the polymer material 131. As discussed above, the CMP residue may comprise a material of the chemical slurry used during the CMP of the polymer material 131. For example, when the chemical slurry comprises silicon oxide, aluminum oxide, combinations thereof, or the like, the CMP residue may likewise comprise molecules of silicon, aluminum, oxygen, combinations thereof, or the like. FIG. 34B illustrates the completed package 506 after further processing, for example, by applying like process steps as those discussed above with respect to FIGS. 12 through 25A. In other embodiments (e.g., similar to FIG. 25B), particularly when the optional back-side redistribution structure 110 and the through vias 112 are omitted, the package 300 may be omitted.

Various embodiments discussed above provide an additional polymer material to fill in and planarize an uneven top surface of an encapsulant in a device package. The polymer material is substantially free of fillers so that the polymer material can be planarized with an improved topography compared to the filler-comprising encapsulant. It has been observed that by providing this polymer material, manufacturing defects in subsequently formed features (e.g., conductive lines of metallization patterns) can be reduced.

In accordance with an embodiment, a method includes encapsulating a semiconductor die in an encapsulant; planarizing the encapsulant; depositing a polymer material on the encapsulant; planarizing the polymer material; and forming a metallization pattern on the polymer material. The metallization pattern electrically connects a die connector of the semiconductor die to a conductive feature disposed outside of the semiconductor die. In an embodiment, the encapsulant comprises a filler, and planarizing the encapsulant exposes a hollow core of the filler, and wherein depositing the polymer material comprises filling the hollow core with the polymer material. In an embodiment, the method further includes forming a polymer layer between the polymer material and the metallization pattern. In an embodiment, forming the metallization pattern includes forming the metallization pattern in physical contact with the polymer material. In an embodiment, the method further includes patterning a first opening through the polymer material to expose the die connector of the semiconductor die and patterning a second opening through the polymer material to expose the conductive feature. Forming the metallization pattern includes forming portions of the metallization pattern in the first opening and the second opening. In an embodiment, patterning the first opening and patterning the second opening is performed prior to planarizing the polymer material. In an embodiment, prior to depositing the polymer material, the method further includes recessing the die connector of the semiconductor die below a top surface of the encapsulant. In an embodiment, planarizing the polymer material exposes a portion of the encapsulant.

In accordance with an embodiment, a method includes disposing a first integrated circuit die adjacent a second integrated circuit die; encapsulating the first integrated circuit die and the second integrated circuit die in a molding compound, the molding compound comprising a plurality of fillers; and planarizing the molding compound to expose a first die connector of the first integrated circuit die and a second die connector of the second integrated circuit die. Planarizing the molding compound defines a plurality of depressions at a top surface of the molding compound. The method further includes depositing a polymer material over the molding compound, the polymer material being disposed in the plurality of depressions at the top surface of the molding compound; planarizing the polymer material; and forming a metallization pattern over the polymer material. The metallization pattern electrically connects the first die connector to the second die connector. In an embodiment, the method further includes depositing a polymer layer over the polymer material and forming the metallization pattern includes forming the metallization pattern over the polymer layer. In an embodiment, forming the metallization pattern comprises includes the metallization pattern in contact with the polymer material. In an embodiment, the method further includes patterning the first die connector and the second die connector below a top surface of the molding compound. In an embodiment, after planarizing the polymer material, top surfaces of the polymer material, the molding compound, the first die connector, and the second die connector are coplanar.

In accordance with an embodiment, a package includes an integrated circuit die comprising a die connector; an encapsulant disposed around the integrated circuit die; a polymer material over at least a portion of the encapsulant; an impurity disposed at a top surface of the polymer material, a material of the impurity being different than the polymer material; and a conductive line over the polymer material. The conductive line electrically connects the die connector to a conductive feature, and a portion of the encapsulant is disposed between the die connector and the conductive feature. In an embodiment, a polymer layer is disposed between the conductive line and the polymer material, and the impurity is disposed at an interface between the polymer material and the polymer layer. In an embodiment, the polymer layer further forms an interface with the encapsulant. In an embodiment, the polymer layer covers an entire top surface of the encapsulant. In an embodiment, the impurity is disposed at an interface between the conductive line and the polymer material. In an embodiment, a top surface of the die connector is disposed below a top surface of the encapsulant, and the polymer material extends from the top surface of the encapsulant to the top surface of the die connector. In an embodiment, the impurity includes silicon, aluminum, or a combination thereof.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
   an integrated circuit die comprising a die connector;
   an encapsulant disposed around the integrated circuit die;
   a polymer material over at least a portion of the encapsulant, wherein a convex surface of the polymer material extends below a topmost surface of the encapsulant;
   an impurity disposed at a top surface of the polymer material, a material of the impurity being different than the polymer material; and
   a conductive line over the polymer material, the conductive line electrically connecting the die connector to a conductive feature, and a portion of the encapsulant is disposed between the die connector and the conductive feature.

2. The package of claim 1, further comprising a polymer layer disposed between the conductive line and the polymer material, the impurity is disposed at an interface between the polymer material and the polymer layer.

3. The package of claim 2, wherein the polymer layer further forms an interface with the encapsulant.

4. The package of claim 2, wherein the polymer layer covers an entire top surface of the encapsulant.

5. The package of claim 1, wherein the impurity is disposed at an interface between the conductive line and the polymer material.

6. The package of claim 1, wherein a top surface of the die connector is disposed below a top surface of the encapsulant, the polymer material extending from the top surface of the encapsulant to the top surface of the die connector.

7. The package of claim 1, wherein the impurity comprises silicon, aluminum, or a combination thereof.

8. A package comprising:
   a semiconductor die;
   a molding material encapsulating the semiconductor die, wherein the molding material comprises a hollow-core filler material;
   a polymer material, wherein a filler material circumferentially surrounds a bottom portion of the polymer material, wherein the filler material is a same material as the hollow-core filler material; and
   a conductive line electrically connected to the semiconductor die, the conductive line further overlying the molding material and the polymer material.

9. The package of claim 8 further comprising an impurity at a top surface of the polymer material.

10. The package of claim 9, wherein the impurity comprises silicon or aluminum.

11. The package of claim 9 further comprising a polymer layer between the conductive line and the polymer material, wherein the impurity is at an interface between the polymer material and the polymer layer.

12. The package of claim 8, wherein top surfaces of the polymer material and the molding material are substantially level.

13. The package of claim 12 further comprising a die connector electrically connecting the conductive line to the semiconductor die, a top surface of the die connector is substantially level with the molding material and the polymer material.

14. The package of claim 13, wherein the polymer material physically contacts the die connector.

15. The package of claim 8, wherein the conductive line physically contacts the polymer material.

16. The package of claim 8, wherein the conductive line physically contacts the filler material.

17. A package comprising:
   a first die;
   a second die;
   a molding compound between the first die and the second die, the molding compound comprising a filler material;
   a polymer material having a top surface substantially planar with the molding compound;
   a polymer layer over the polymer material, wherein an impurity is disposed at an interface between the polymer material and the polymer layer, wherein the impurity comprises silicon or aluminum; and a conductive line over the polymer layer, the conductive line electrically connects the first die to the second die.

18. The package of claim 17 further comprising a dielectric material around a first die connector of the first die, the dielectric material is co-terminus with the first die.

19. The package of claim 17, wherein the filler material surrounds a bottom portion of the polymer material.

20. The package of claim 17, wherein the filler material physically contacts a second die connector of the second die.

* * * * *